(12) United States Patent
Yoshida et al.

(10) Patent No.: US 9,923,165 B2
(45) Date of Patent: Mar. 20, 2018

(54) TRANSPARENT ELECTRODE, METHOD FOR PRODUCING TRANSPARENT ELECTRODE AND ELECTRONIC DEVICE

(71) Applicant: KONICA MINOLTA, INC., Tokyo (JP)

(72) Inventors: Kazuhiro Yoshida, Hino (JP); Shigeru Kojima, Hino (JP); Shun Furukawa, Sagamihara (JP); Takeshi Hakii, Sagamihara (JP); Toshiyuki Kinoshita, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/326,601

(22) PCT Filed: Jul. 24, 2015

(86) PCT No.: PCT/JP2015/071152
§ 371 (c)(1),
(2) Date: Jan. 16, 2017

(87) PCT Pub. No.: WO2016/027620
PCT Pub. Date: Feb. 25, 2016

(65) Prior Publication Data
US 2017/0200913 A1    Jul. 13, 2017

(30) Foreign Application Priority Data

Aug. 21, 2014    (JP) ................................ 2014-168436

(51) Int. Cl.
*H01L 21/00* (2006.01)
*H01L 29/08* (2006.01)
(Continued)

(52) U.S. Cl.
CPC ............ *H01L 51/5215* (2013.01); *B32B 5/16* (2013.01); *B32B 7/02* (2013.01); *B32B 37/14* (2013.01);
(Continued)

(58) Field of Classification Search
CPC . H01L 51/5215; H01L 51/5234; H01L 51/56; H01L 2251/305; H01L 2251/5369;
(Continued)

(56) References Cited

U.S. PATENT DOCUMENTS

2009/0115328 A1* 5/2009 Yamashita ............. H05B 33/22
                                                                313/504
2013/0122279 A1* 5/2013 Tsujimoto ................ H01B 1/20
                                                                428/315.7

FOREIGN PATENT DOCUMENTS

CN    101960374 A    1/2011
CN    103198884 A    7/2013
(Continued)

OTHER PUBLICATIONS

International Search Report dated Oct. 20, 2015 for PCT/JP2015/071152 and English translation.
(Continued)

*Primary Examiner* — Thinh T Nguyen
(74) *Attorney, Agent, or Firm* — Lucas & Mercanti, LLP

(57) ABSTRACT

Provided are: a transparent electrode which exhibits excellent resistance to high temperature and high humidity, while having surface smoothness; a method for producing this transparent electrode; and an electronic device which has improved reliability by using this transparent electrode. A transparent electrode is configured to comprise a metal thin wire pattern that is formed on one main surface of a transparent substrate using metal nanoparticles and a metal oxide layer that has a surface roughness of 5 nm or less and (Continued)

is formed on the main surface of the transparent substrate so as to cover the surface of the metal thin wire pattern.

10 Claims, 5 Drawing Sheets

(51) Int. Cl.
  *H01L 51/52*  (2006.01)
  *B32B 7/02*  (2006.01)
  *B32B 5/16*  (2006.01)
  *B32B 37/14*  (2006.01)
  *H01L 51/56*  (2006.01)

(52) U.S. Cl.
  CPC .......... *H01L 51/5234* (2013.01); *H01L 51/56* (2013.01); *B32B 2457/206* (2013.01); *H01L 2251/305* (2013.01); *H01L 2251/5369* (2013.01)

(58) Field of Classification Search
  CPC ................ H01L 51/5212; H01L 51/445; H01L 51/0022; B32B 7/02; B32B 5/16; B32B 37/14; B32B 2457/206
  USPC ...... 257/40, 43, 72, 700; 438/82, 99, 85, 86, 438/104
  See application file for complete search history.

(56) References Cited

FOREIGN PATENT DOCUMENTS

| | | |
|---|---|---|
| JP | 2009004348 A | 1/2009 |
| JP | 20090174925 A | 8/2009 |
| JP | 2012248383 A | 12/2012 |
| JP | 2012252856 A | 12/2012 |
| JP | 2013058389 A | 3/2013 |
| JP | 2013089397 A | 5/2013 |
| JP | 2013218857 A | 10/2013 |
| KR | 10-2010-0111705 A | 10/2010 |
| KR | 10-2013-0037925 A | 4/2013 |
| WO | 2012020657 A1 | 2/2012 |

OTHER PUBLICATIONS

Office Action dated Sep. 5, 2017 from corresponding Chinese Application No. CN 201580044711.1 and English translation.
Office Action dated Dec. 19, 2017 from corresponding Korean Application No. KR 10-2016-7035009 and English translation.

* cited by examiner

TRANSPARENT ELECTRODE, METHOD FOR PRODUCING TRANSPARENT ELECTRODE AND ELECTRONIC DEVICE

CROSS REFERENCE TO RELATED APPLICATION

This Application is a 371 of PCT/JP2015/071152 filed on Jul. 24, 2015 which, in turn, claimed the priority of Japanese Patent Application No. 2014-168436 filed on Aug. 21, 2014, both applications are incorporated herein by reference.

TECHNICAL FIELD

The present invention relates to a transparent electrode, a method for producing the transparent electrode, and an electronic device using the transparent electrode.

BACKGROUND ART

At present, an organic electroluminescent element receives attention as a thin light-emitting material.

An organic electroluminescent element (so-called organic EL element) utilizing electroluminescence (Electro Luminescence: EL) of an organic material is a thin-film-type completely solid-state element that can emit light at a low voltage of approximately several volts to several ten volts, and has many excellent advantages such as high luminance, high light-emission efficiency, thin type and light weight. Accordingly, in recent years, the element has attracted attention, as surface emitting bodies such as: backlights for various kinds of displays; display boards for signboards, emergency lights and the like; and lighting sources.

The organic EL element as described above has a configuration in which a light-emitting layer composed of an organic material is arranged between two electrodes, and emitted light generated in the light-emitting layer is externally extracted through the electrode. Therefore, at least one of the two electrodes is constituted as a transparent electrode, and the emitted light is extracted from the transparent electrode side.

Note that the transparent electrode is also utilized not only for the organic EL element, but also as an electrode for a solar cell, a touch panel, a liquid display element, various light receiving elements, and the like. Furthermore, since the transparent electrode is usually a thin electrically conductive film, the transparent electrode is also used as a flexible electronic device by utilizing the small thickness.

In recent years, in the above electronic devices, the reduction in electric resistance has been required for making an area of the transparent electrode large. Therefore, in order to aim at lowering the electric resistance, there have been proposed a transparent electrode having a thin wire structure portion of an electrically conductive metal material and a translucent electrically conductive film (for example, refer to the following Patent Literature 1), and a configuration having an electrically conductive metal thin wire pattern formed by metal nanoparticles and an electrically conductive polymer-containing layer on the metal thin wire pattern (for example, refer to the following Patent Literature 2).

CITATION LIST

Patent Literature

PTL 1: Japanese Patent Laid-Open No. 2009-4348
PTL 2: Japanese Patent Laid-Open No. 2013-89397

SUMMARY OF INVENTION

Technical Problem

However, since such a transparent electrode is insufficient in surface smoothness of the electrode, when using for the electronic device, there is a problem that, for example, a failure such as short circuit of the electrode or short circuiting is generated, with partial projections or the like on the electrode surface as a starting point. Furthermore, since the transparent electrode having the configuration shown in the above Patent Literature 2 is made of the electrically conductive polymer, there is a problem that properties are degraded under high temperature and high humidity.

Accordingly, objects of the present invention are to provide a transparent electrode that exhibits excellent resistance to high temperature and high humidity while having surface smoothness, a method for producing the transparent electrode, and an electronic device which has enhanced reliability by using the transparent electrode.

Solution to Problem

The transparent electrode of the present invention for achieving the above objects includes a metal thin wire pattern that is constituted by use of metal nanoparticles and that is provided on one main surface of a transparent substrate and a metal oxide layer that is provided on the main surface of the transparent substrate so as to cover a surface of the metal thin wire pattern and that has a surface roughness of 5 nm or less.

Furthermore, the method for producing the transparent electrode of the present invention includes a first step of forming a metal thin wire pattern which is composed of metal nanoparticles on a transparent substrate, and a second step of depositing a metal oxide layer on the transparent electrode so as to cover the metal thin wire pattern and to have a surface roughness of 5 nm or less.

Furthermore, the electronic device of the present invention has a feature of including the transparent electrode with the above configuration. The electronic device is, for example, an organic electroluminescent element.

Advantageous Effects of Invention

According to the present invention, a transparent electrode exhibiting excellent resistance to high temperature and high humidity while having surface smoothness, and an electronic device having enhanced reliability by use of the transparent electrode can be provided.

DESCRIPTION OF EMBODIMENTS

Hereinafter, embodiments of the present invention will be explained on the basis of the drawings in the following order.

1. First embodiment: Transparent electrode
1-1. Modification: Transparent electrode where the light extraction layer is provided
2. Second embodiment: Production apparatus and method for the transparent electrode
3. Third embodiment: Uses of transparent electrode
4. Fourth embodiment: Electronic device (organic EL element)
5. Fifth embodiment: Uses of electronic device (organic EL element)

1. First Embodiment: Transparent Electrode

Figure 1:
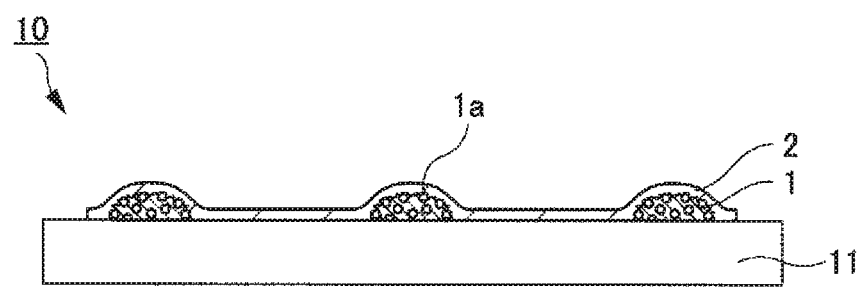
FIG. 1 is a schematic cross-sectional view showing a configuration of the transparent electrode according to a first embodiment of the present invention.

FIG. 1 is a schematic cross-sectional view showing a configuration of the transparent electrode according to the first embodiment of the present invention. As shown in the figure, a transparent electrode 10 has a three-layered structure in which a metal thin wire pattern 1 and a metal oxide layer 2 are laminated on one main surface of a transparent substrate 11. Namely, for example, the metal thin wire pattern 1 and the metal oxide layer 2 are provided on the transparent substrate 11 in this order. The characteristic features of the transparent electrode 10 are that the metal thin wire pattern 1 is composed of a metal nanoparticle 1a, and the metal oxide layer 2 is provided on the transparent substrate 11 so as to cover the surface of the metal thin wire pattern 1 and has a surface roughness of 5 nm or less.

Hereinafter, the respective constituent elements which constitute the transparent electrode 10 having the above laminated structure will be explained in detail in the order of the transparent substrate 11, the metal thin wire pattern 1, and the metal oxide layer 2. Note that, in the present invention, the fact that the transparent electrode 10 is transparent means that light permeability at a wavelength of 550 nm is 50% or more.

Furthermore, a sheet resistance (Ω/sq.) of the transparent electrode used for the electronic device of large area is preferably 1 (Ω/sq.) or less, more preferably 0.5 (Ω/sq.) or less. The sheet resistance (Ω/sq.) can be measured in accordance with, for example, JIS K6911, ASTM D257 or the like, and can also be measured by using a commercially available surface resistivity instrument.

<Transparent Substrate>

The transparent substrate 11 used for the transparent electrode of the present invention is not particularly limited as long as the substrate has a high light transparency. Although examples of the transparent substrates preferably include a resin substrate, a resin film, a glass, and the like, it is preferable to use a transparent resin film from the viewpoint of productivity, and from the viewpoints of properties such as lightness and flexibility.

The transparent resin film is not particularly limited, and the material, shape, structure, thickness, and the like, can be adequately selected from the known resin films. Examples thereof can include a polyester-based resin film such as polyethylene terephthalate (PET), polyethylene naphthalate (PEN), or a modified polyester; a polyolefin-based resin film such as a polyethylene (PE) resin film, a polypropylene (PP) resin film, a polystyrene resin film, or a cycloolefin-based resin; a vinyl-based resin film such as polyvinyl chloride or polyvinylidene chloride; a polyether ether ketone (PEEK) resin film, a polysulfone (PSF) resin film, a polyether sulfone (PES) resin film, a polycarbonate (PC) resin film, a polyamide resin film, a polyimide resin film, an acrylate resin film, a triacetyl cellulose (TAC) resin film, and the like. In addition, particularly, a transparent resin film having permeability at a wavelength of visual range (380 to 780 nm) of 80% or more can be preferably applied.

Among them, from the viewpoints of transparency, heat resistance, handling ease, strength and cost performance, preferable transparent resin film is a biaxially stretched polyester resin film such as a biaxially stretched polyethylene terephthalate resin film, a biaxially stretched polyethylene naphthalate resin film, a polyether sulfone resin film, or a polycarbonate resin film, and more preferable is the biaxially stretched polyethylene terephthalate resin film, or the biaxially stretched polyethylene naphthalate resin film.

Furthermore, in order to ensure the wettability and adhesiveness of the coating solution, the transparent substrate 11 can be subjected to surface treatment or can be provided with an easily adhesive layer. Known technique can be used as the surface treatment and the easily adhesive layer of the transparent substrate 11. Examples of the surface treatments of the transparent substrate 11 can include surface activation treatments such as corona discharge treatment, flame treatment, ultraviolet ray treatment, high frequency treatment, glow discharge treatment, active plasma treatment, and laser treatment.

Furthermore, examples of the materials constituting the easily adhesive layer can include polyester, polyamide, polyurethane, a vinyl-based copolymer, a butadiene-based copolymer, an acrylate-based copolymer, a vinylidene-based copolymer, an epoxy-based copolymer, and the like. The easily adhesive layer may have a mono-layer, or may have two or more layers in order to enhance the adhesiveness.

Moreover, a film made of inorganic materials or organic materials, or a hybrid film obtained by combining both of these films may be formed on the surface or the back surface of the transparent substrate 11. Each of the film and the hybrid film as described above is preferably a barrier film having a water vapor permeability (25±0.5° C., relative humidity (90±2)% RH) measured by the method in accordance with JIS-K-7129-1992 of $1\times10^{-3}$ g/(m$^2 \cdot$24 hr) or less. Furthermore, each of these films is preferably a high barrier film having an oxygen permeability measured by the method in accordance with JIS K7126-1987 of $1\times10^{-3}$ ml/m$^2 \cdot$24 hr·atm or less (1 atm is $1.01325\times10^5$ Pa) and a water vapor permeability (25±0.5° C., relative humidity (90±2)% RH) of $1\times10^{-3}$ g/(m$^2 \cdot$24 hr) or less.

The material to form the barrier film may be a material having a function to suppress penetration of substances such as water vapor and oxygen which deteriorate an element, and for example, there can be used silicon oxide, silicon dioxide, silicon nitride, etc. Further, in order to improve fragility of the barrier film, it is more preferably to give a laminated structure of the inorganic material layer and the organic material layer. Note that the order of lamination of the inorganic material layer and the organic material layer is not particularly limited, and is preferable to laminate alternately the both layers a plurality of times.

<Metal Thin Wire Pattern>

The metal thin wire pattern 1 of the present invention is constituted by using metal nanoparticles 1a and is provided on one main surface of the transparent substrate 11.

A metal material constituting the metal nanoparticle 1a is not particularly limited as long as the material is excellent in electric conductivity, and examples thereof may be an alloy in addition to metals such as gold, silver, copper, iron, nickel, and chromium, and preferable is silver from the viewpoint of electric conductivity and stability.

In addition, an average particle size of the metal nanoparticle 1a is preferably 1 nm or more and 100 nm or less, more preferably 1 nm or more and 50 nm or less, particularly preferably 1 nm or more and 30 nm or less. When the average particle size of the metal nanoparticle 1a is 1 nm or more, dispersibility to a solvent becomes excellent, and also an adhesion property to the transparent substrate becomes excellent. Furthermore, when the average particle size is 100 nm or less, the electric conductivity can be secured without influence on the transparency of the transparent electrode.

Here, the average particle size of the metal nanoparticle 1a can be obtained by randomly observing 200 particles or more of the metal nanoparticle 1a each observable as a round shape, an elliptical shape or substantially a round shape or an elliptical shape from electro microscopic observation of the metal nanoparticle 1a, and by obtaining a particle size of each metal nanoparticle 1a to calculate a number average value thereof. Here, the average particle size according to the present invention is a minimum distance of the distance which is obtained by sandwiching, with two parallel lines, the outline of the metal nanoparticle 1a observable as a round shape, an elliptical shape or substantially a round shape or an elliptical shape. Note that, when the average particle size of the metal nanoparticle 1a is measured, a metal nanoparticle 1a which shows apparently the side surface is not measured.

The pattern form of the metal thin wire pattern 1 is not particularly limited, and may be, for example, a stripe pattern or a mesh pattern, and the metal thin wire pattern 1 is preferably provided so that an opening ratio of the transparent electrode 10 is 80% or more from the viewpoint of transparency.

The opening ratio of the transparent electrode 10 indicates the ratio of areas having a light transmitting property accounting for the whole area. For example, in a case where the metal thin wire patter 1 is composed of a metal material which cannot pass light, and in a case where the pattern is formed in a stripe pattern having a line width of 100 μm and a line interval of 1 mm, the opening ratio of the transparent electrode 10 is approximately 90%.

The line width of the pattern form of the metal thin wire pattern 1 is preferably 10 to 200 μm. When the line width of the pattern form is 10 μm or more, desired electric conductivity can be ensured. Furthermore, when the line width of the pattern form is 200 μm or less, sufficient transparency can be ensured as the transparent electrode.

A height of the metal thin wire pattern 1 is preferably 0.1 to 5 μm. When the height of the metal thin wire pattern 1 is 0.1 μm or more, desired electric conductivity can be ensured. Furthermore, when the height of the metal thin wire pattern 1 is 5 μm or less, for example, in the case where the transparent electrode 10 is used as the electronic device such as the organic EL element, the difference of unevenness due to the height of the metal thin wire pattern does not exert influence on a distribution of film thickness of a light-emitting function layer formed thereon.

<Method for Forming Metal Thin Wire Pattern>

In the formation method of the metal thin wire pattern 1, the method of performing printing of an ink containing the metal nanoparticles 1a so as to have the desired pattern form is preferable. The printing method as described above is not particularly limited, and the ink can be formed into desired pattern form by known printing methods such as gravure printing, flexographic printing, offset printing, screen printing, and inkjet printing.

<Metal Oxide Layer>

The metal oxide layer 2 is provided on one main surface of the transparent substrate 11 so as to cover the surface of the metal thin wire pattern 1, and is characterized in that a surface roughness is 5 nm or less (preferably 3 nm or less). Furthermore, the metal oxide layer 2 is preferably constituted by using a layer medium and the metal oxide nanoparticles which are dispersed into the layer medium.

Note that the surface roughness is an arithmetical average roughness Ra (nm), and is measured by, for example, using an atomic force microscope (manufactured by Digital Instruments Ltd.).

Since the metal tin wire pattern 1 is constituted by using the metal nanoparticles 1a, the pattern has projections on the surface by mutual aggregation of the particles during the pattern forming step and the drying step. The metal oxide layer 2 can embed the projections of the metal thin wire pattern 1 as described above to thereby have the surface roughness of 5 nm or less.

A film thickness of the metal oxide layer 2 is preferably 0.05 to 5 μm, further preferably 0.1 to 2 μm. When the film thickness of the metal oxide layer 2 is 0.1 μm or more, sufficient surface smoothness of the transparent electrode 10 can be secured. Furthermore, when the film thickness of the metal oxide layer 2 is 2 μm or less, the transparency of the transparent electrode 10 is not affected.

Here, if the film thickness of the metal oxide layer 2 is formed so as to cover the surface of the metal thin wire pattern 1, the thickness may be smaller than the height (thickness) of the metal thin wire pattern 1 as shown in FIG. 1.

[1. Metal Oxide Nanoparticle]

The metal oxide material constituting the metal oxide nanoparticle is not particularly limited, and examples thereof include indium tin oxide (ITO), tin oxide (SnO), zinc oxide (ZnO), and the like, and preferable is ITO from the viewpoint of electric conductivity.

Furthermore, an average particle size of the metal oxide nanoparticle is preferably 100 nm or less, more preferably 50 nm or less, and particularly preferably 30 nm or less. When the average particle size is 100 nm or less, the electric conductivity and the surface smoothness of the electrode can be secured without the influence on the transparency of the transparent electrode 10. Moreover, when the average particle size is 50 nm or less, further excellent electric conductivity and surface smoothness of the electrode can be obtained.

Note that the metal oxide layer 2 may be constituted by using the metal oxide nanoparticles having the same average particle size, or may be constituted by combining the particles having the different average particle size.

Here, the average particle size of the metal oxide nanoparticle can be measured similarly to the method for measuring the metal nanoparticle 1a of the above metal thin wire pattern.

[2. Method for Fabricating Metal Oxide Nanoparticle]

A method for producing ITO particles will be explained as one example of a method for producing the metal oxide nanoparticle.

(2.1 Fabrication of Solution Containing Indium and Tin)

First, a solution containing indium and tin is produced. The solution is prepared by dissolving an indium salt and a tin salt into a solvent, and by adjusting an indium concentration of 0.1 to 4.0 mol/L, preferably 0.2 to 2.0 mol/L. Furthermore, an addition amount of the tin salt is 5 to 20 mol % relative to indium.

From the viewpoint of uniformly dissolving the indium salt and the tin salt or enhancing the conductivity of ITO, an organic solvent having at least one OH group per one molecule is preferable as the solvent, and more preferable solvent is a polyol having two or more OH group. Specifically, alcohols, particularly, polyhydric alcohols are preferable, and more preferable ones are ethylene glycol and diethylene glycol, but is not limited thereto, as long as there is used the solvent that can be easily evaporated at a heating temperature at the time of deposition of the metal oxide layer 2, and for example, there may be used a polyhydric alcohol having a boiling point of 100° C. to 300° C. or less, further preferably 250° C. or less, or a derivative thereof, and further an ionic liquid may also be used.

Note that the solvent may be used alone or in combination of two or more kinds. Further preferably, there is used a water-soluble organic solvent having a hydrophilic property so as to dissolve water in an amount of 50% by volume or more.

Examples of the indium salts include at least one of an anhydrous crystal salt of indium selected from the group consisting of $In_2(C_2O_4)_3$, $InCl_3$, $In(NO_3)_3$ and $In_2(SO_4)_3$, or a crystal salt of a hydrate of $In(NO_3)_3 \cdot 3H_2O$, $InCl_3 \cdot 4H_2O$, $In_2(SO_4)_3 \cdot 9H_2O$, etc., and the like. Furthermore, the indium salt can be obtained in a state of being dissolved in a solvent, by dissolving, into an organic solvent, a solution obtained by dissolving an indium metal to $H_2C_2O_4$, $HNO_3$, $HCl$, $H_2SO_4$, etc. in an organic solvent.

Note that, from the viewpoint of lowering an amount of contained water in the organic solvent, it is preferable to use a anhydrous crystal salt.

Examples of the tin salts include at least one of an anhydrous crystal salt of tin selected from the group consisting of $Sn_2(C_2O_4)_3$, $SnCl_2$, $SnCl_4$, $Sn(NO_3)_2$ and $SnSO_4$, or a crystal salt of a hydrate of $Sn(NO_3)_3 \cdot 3H_2O$, $SnCl_3 \cdot 2H_2O$, $SnCl_4 \cdot 5H_2O$, $Sn(SO_4)_2 \cdot 2H_2O$, etc., and the like. Furthermore, the tin salt can be obtained in a state of being dissolved in a solvent, by dissolving, into an organic solvent, a solution obtained by dissolving a tin metal to $H_2C_2O_4$, $HNO_3$, $HCl$, $H_2SO_4$, etc. Moreover, an organic tin such as tetramethyltin or tetrabutyltin may be dissolved in an organic solvent for the use.

Note that, from the viewpoint of lowering an amount of contained water in the organic solvent, it is preferable to use the anhydrous crystal salt or the organic tin, and from the viewpoint of handling safety, it is preferable to use the anhydrous crystal salt.

An indium concentration in the solution containing indium and tin is regulated to 0.1 to 4.0 mol/L, and more preferably 0.2 to 2.0 mol/L, before neutralization reaction. When the indium concentration is 0.1 mol/L or more, productivity of the ITO particle can be ensured. Furthermore, when the indium concentration is 4.0 mol/L or less, the indium salt is dissolved without precipitation in the organic solvent, and the indium salt uniformly exist in the organic solvent in the solution at the time of the heat treatment as described later, with the result that particles having uniform particle size can be produced.

(2.2 Fabrication of Tin-Containing Indium Hydroxide Precipitation Solution)

Next, a temperature of the solution containing indium and tin is maintained within the range of 5° C. to 95° C., preferably 10° C. to 50° C. Then, a solution containing a basic salt is added to the solution having been kept warm, within 24 hours, preferably, at an addition time of 1 minute to 120 minutes, and thus a precipitation solution containing tin-containing indium hydroxide (hereinafter referred to as "tin-containing indium hydroxide precipitation solution") is produced.

The solution containing the basic salt is produced by dissolving the basic salt in the above organic solvent as a precipitating agent.

Examples of the basic salts include NaOH, KOH, $NH_4OH$, $NH_3$, $NH_4HCO_3$ and $(NH_4)_2CO_3$, and the like, and it is preferable to use NaOH and $(NH_4)_2CO_3$. Note that the basic salt may be at least one basic salt selected from the group, and may be used in the mixture of two or more kinds.

An addition amount of the basic salt to be added is 0.5 to 100 equivalent amount to the indium salt, preferably 1.0 to 10 equivalent amount. As a charging amount of the basic salt is larger, the pH change at the time of precipitation drastically takes place to thereby generate fine particles.

(2.3 Heat Treatment)

Subsequently, in order to obtain the ITO particles from the generated tin-containing indium hydroxide particles, the tin-containing indium hydroxide precipitation solution obtained is subjected to heat treatment (autoclave treatment) in a sealed container. At this time, from the viewpoint of avoiding increase of aggregates, it is preferable that the tin-containing indium hydroxide particles are subjected to solid-liquid separation from the precipitation solution and the particles then proceed to the heat treatment (autoclave treatment) step without being dried.

Note that a water content contained in the tin-containing indium hydroxide precipitation solution to be heat-treated in the sealed container is preferably 15% by mass or less, more preferably 5% by mass or less, from the viewpoint of generating a highly pure tin-containing indium hydroxide.

The temperature of heat treatment and the period of time of the treatment are appropriately set in accordance with the materials to be used. Examples of the heating apparatus include mantle heater, ribbon heater, oil bath, and the like. Furthermore, the reactor to be used is preferably one having a function of maintaining a sealing state even under a vapor pressure at 300° C. of the solvent used.

(2.4 Solid-Liquid Separation and Washing)

Then, the solid-liquid separation and washing are carried out to thereby give slurry of the ITO particles. Here, the slurry of the ITO particles may be sent to the producing step of the metal oxide layer 2 described later, or may be dried once to thereby be formed into the ITO particles and then may be sent to the production step of the metal oxide layer 2.

Note that the particle size of the ITO particles is regulated by control of the charging amount of the basic salt, and the temperature and time of the heating.

[3. Layer Medium]

The layer medium that disperses the metal oxide nanoparticles is constituted by use of a resin material (binder).

The resin material (binder) is not particularly limited, and a conventionally known material can be used. Examples include an acrylic polymer such as polyacrylonitrile, a polythiophene such as PEDOT (poly(3,4-ethylenedioxythiophene)), or polyaniline.

<Method for Forming Metal Oxide Layer>

In the method for forming the metal oxide layer 2, the layer may be formed by, for example, coating, on the transparent substrate 11 formed with the metal thin wire pattern 1, a dispersion liquid in which the binder of the above-mentioned layer medium and the metal oxide nanoparticles are dispersed in a solvent, and by being subjected to a drying treatment.

Examples of the solvents include an alcohol, a ketone, an ether, an ester, toluene, cyclohexane, and the like, other than the organic solvents used for the formation of the metal oxide nanoparticles, and may be a pure water. Furthermore, the organic solvent may be used together with a dispersing agent such as a surfactant or a coupling agent.

The coating method is not particularly limited, and known printing methods can be widely used. Examples include various methods such as, for example, a gravure coater method, a flexo printing method, a screen printing method, a microcontact printing method, an inkjet method, and further a super inkjet method in which a greatly minute amount of droplets is discharged, and the preferred method is a method without use of a plate such as the inkjet method or the super inkjet method.

Examples of the drying treatments include a drying treatment by a hot plate, a drying treatment by infrared irradiation or flash light irradiation. Among them, the drying treatment by the infrared irradiation or the flash light irradiation is preferable from the viewpoints that the substrate is not damaged, the solvent can be efficiently removed, and a uniform distribution of layer thickness can be obtained. Accordingly, the metal oxide layer 2 having a surface roughness of 5 nm or less can be deposited.

Here, in a case of the drying treatment by the infrared irradiation, it is preferable to carry out drying by selective irradiation with an infrared ray having a specified wavelength by, for example, a wavelength control infrared heater, or the like. Accordingly, for example, it is possible to cut light having the specified wavelength region absorbed by the transparent substrate 11, and to perform selective irradiation with light having a wavelength that is effective for evaporating the solvent constituting the metal oxide layer 2, and thus it is possible to dry even the thin transparent substrate 11 without deformation.

Note that the metal oxide layer 2 of the present invention may have any aspect as long as the layer has a configuration in which the surface roughness of 5 nm or less is satisfied. For example, although the metal oxide layer 2 according to the present embodiment is constituted by use of the layer medium (binder) and the metal oxide nanoparticles dispersed in the layer medium, the metal oxide layer may be constituted without use of the layer medium. In this case, in the above-mentioned method for forming the metal oxide layer 2, the layer may be formed by coating, on the transparent substrate 11 formed with the metal thin wire pattern 1, a dispersion liquid in which the metal oxide nanoparticles are dispersed in a solvent, and by being subjected to the drying treatment.

Furthermore, the metal oxide layer may be formed as a solid film composed of the above-mentioned metal oxide material.

Moreover, the above transparent electrode 10 may be covered by a protective film in a state where the metal thin wire pattern 1 and the metal oxide layer 2 are sandwiched between the transparent substrate 11 and the transparent electrode 10, or other electrically conductive layer may be laminated. In this case, it is preferable that the protective film and the electrically conductive layer have a light-transmitting property so as not to impair its light-transmitting property of the transparent electrode 10. In addition, the configuration may be such that a layer is provided as necessary also between the metal thin wire pattern 1 and the transparent substrate 11.

<Effects>

The transparent electrode 10 having the above configuration is provided on one main surface of the transparent substrate 11 so as to cover the surface of the metal thin wire pattern 1 and has the metal oxide layer 2 that has a surface roughness of 5 nm or less. Thereby, for example, in comparison with a case where the electrically conductive polymer is used as the material that covers the surface of the metal thin wire pattern 1, there is obtained the transparent electrode 10 which does not degrade its properties under the circumstance of the high temperature and the high humidity, and which is excellent in resistance against high temperature and high humidity while having the surface smoothness. The electronic device obtained by using the transparent electrode 10 as described above enhances reliability.

Furthermore, the metal oxide layer 2 which configures the transparent electrode 10 is constituted by using the metal oxide nanoparticles. Accordingly, in a case where there are partial projections on the electrode surface of the metal thin wire pattern 1, a space portion between the projections is embedded by uniformly dispersing the metal oxide nanoparticles, and thus the transparent electrode 10 having further excellent surface smoothness can be obtained.

<<1-1. Modification: Transparent Electrode Provided with Light-Scattering Layer>>

Figure 2:
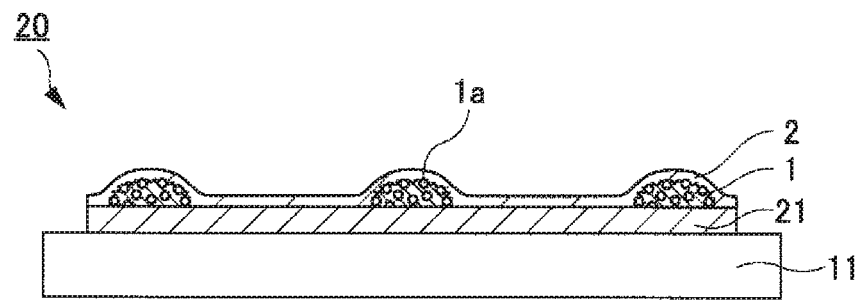
FIG. 2 is a schematic cross-sectional view showing a configuration of a modification of the transparent electrode according to the first embodiment of the present invention.

FIG. 2 is a schematic cross-sectional view showing a configuration of the modification of the transparent electrode according to the first embodiment of the present invention. The different point of a transparent electrode 20 shown in the figure from the transparent electrode 10 explained by use of the prior FIG. 1 is that a light extraction layer 21 is provided between the transparent substrate 11 and the metal thin wire pattern 1 and the metal oxide layer 2 to thereby form the four-layered structure, and the other configurations are the same. Namely, for example, the light extraction layer 21, the metal thin wire pattern 1 and the metal oxide layer 2 are laminated on the transparent substrate 11 in this order. Accordingly, the same symbols are attached to the same constituent elements, and thus overlapped explanation is omitted.

<Light Extraction Layer>

The light extraction layer 21 is a layer that enhances the light extraction efficiency from the transparent substrate 11 side, and is provided among the transparent substrate 11, the metal thin wire pattern 1 and the metal oxide layer 2. In addition, the light extraction layer 21 is constituted by use of the layer medium (binder) and light-scattering particles, and is a mixed light scattering layer by utilization of the refractive index difference due to mixture of the layer medium and the light scattering particles.

The light extraction layer 21 as described above has a higher refractive index than the metal oxide layer 2, and is preferably a high-refractive-index layer in which the refractive index at a wavelength of 550 nm is within the range of 1.7 or more and less than 3.0. In this case, it is preferable that the refractive index is higher by 0.1 or more than that of the metal oxide layer 2, more preferably by 0.3 or more. Furthermore, in a case where the layer medium and the light scattering particles are mixed, the light extraction layer 21 is sufficed by satisfying the requirement that the refractive index is 1.7 or more and less than 3.0, and the refractive index of each material may be less than 1.7 or 3.0 or more.

In a case of the mixed system like this, the refractive index of the light extraction layer 21 can be replaced by a calculated refractive index that is calculated from a total value obtained by multiplying the refractive index inherent to each material by its mixing ratio.

Note that the measurement of the refractive index is carried out by irradiation with the light beam having the shortest maximum emission wavelength in the maximum emission wavelength of the emitted light from the light-emitting unit under an atmosphere of 25° C., and by use of Abbe refractometer (manufactured by ATAGA Co., DR-M2).

Furthermore, the light extraction layer 21 has preferably an optical permeability of 50% or more, more preferably 55% or more, and particularly preferably 60% or more.

Moreover, a smooth layer for smoothing the surface may be formed on one main surface of the light extraction layer 21.

The light scattering particle is not particularly limited and can be appropriately selected depending on the purpose, and may be an organic fine particle or an inorganic fine particle. Among them, a fine particle having a high refractive index (high refractive index particle) is preferable. Here, from the viewpoint of the enhancement of dispersibility and stability, there may be used the light scattering particle subjected to a surface treatment.

Moreover, the conventionally known resin (binder) is usable as the binder without particular limitation, and can be appropriately selected depending on the purpose.

<Method for Forming Light Extraction Layer>

In the formation of the light extraction layer 21, the layer may be formed by, for example, coating, on the transparent substrate 11, a coating liquid in which the binder and the light scattering particles are dispersed in a solvent, and is subjected to a drying treatment. Note that, when a curable material is used as the binder, curing treatment is carried out.

The coating method, and drying treatment can be achieved in the similar way to that explained in the above metal oxide layer 2.

In the curing treatment, in a case of using the ultraviolet curable resin as a binder, any ultraviolet irradiation method may be adopted as long as the coating solution after drying treatment can be irradiated with the ultraviolet ray. For example, there can be utilized an ultraviolet ray or the like emitted from light beams such as an ultra-high-pressure mercury lamp, a high-pressure mercury lamp, a low-pressure mercury lamp, a carbon arc, a xenon arc, and a metal halide lamp, and there is preferably used an ultraviolet ray from an excimer UV lamp.

Furthermore, in a case of using the ionizing radiation curable resin composition as the binder, the ionizing radiation curable resin composition can be cured by an ordinary method, namely, by irradiation with an electron beam or an ultraviolet ray. For example, there are used an electron beam and the like emitted from various electron beam accelerators such as cock Krumlov Walton type, Van de Graaff type, resonance transformer type, insulated core transformer type, linear type, Dynamitron type, and high frequency type having an energy within the range of 10 to 1000 keV, preferably within the range of 30 to 300 keV. Among them, the electron beam having especially weak electron beam intensity is preferable, and particularly, the electron beam source "EB engine" manufactured by Hamamatsu Photonics KK, and the like can be preferably applied.

Moreover, the above transparent electrode 20 may be covered by a protective film in a state where the light extraction layer 21, the metal thin wire pattern 1 and the metal oxide layer 2 are sandwiched between the transparent substrate 11 and the transparent electrode 20, or other electrically conductive layer may be laminated. In this case, it is preferable that the protective film and the electrically conductive layer have a light-transmitting property so as not to impair its light-transmitting property of the transparent electrode 20. In addition, the configuration may be such that a layer is provided as necessary also between the metal thin wire pattern 1 and the transparent substrate 11.

<Effects>

The transparent electrode 20 having the above configuration has a configuration in which the light extraction layer 21 is provided among the transparent substrate 11, the metal thin wire pattern 1 and the metal oxide layer 2. Accordingly, in addition to the effects of the first embodiment, the light-transmitting property from the transparent substrate 11 side can be enhanced. In addition, the electronic device using the transparent electrode 20 as described above has enhanced light-emission efficiency in a case of the use as the organic EL element.

Figure 3:
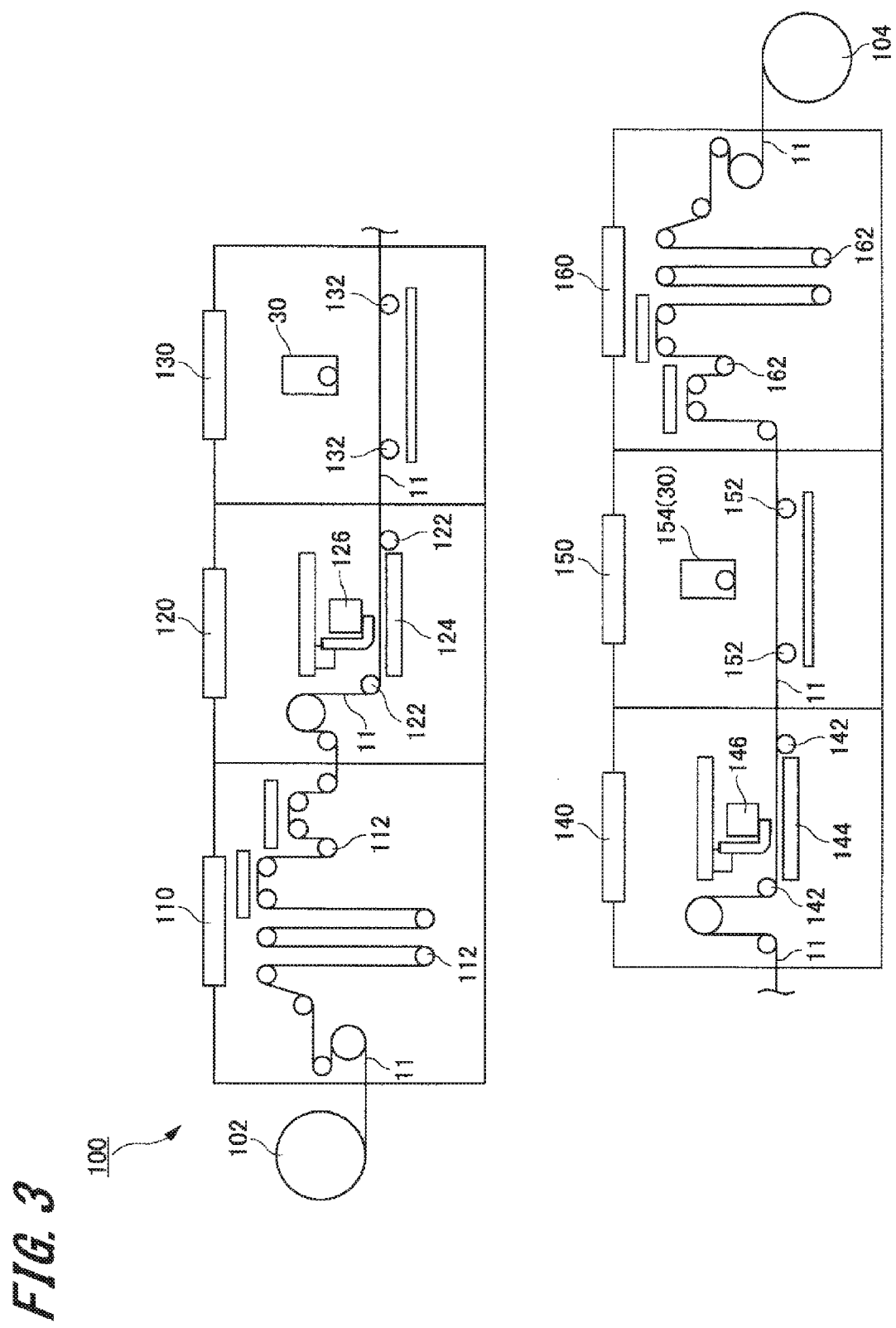
FIG. 3 is a structural view of a production apparatus used for the production of the transparent electrode according to a second embodiment of the present invention.

2. Second Embodiment: Production Apparatus and Production Method of Transparent Electrode FIG. 3 is a structural view of the production apparatus used for the production of the transparent electrode according to the second embodiment of the present invention. As shown in the figure, the production apparatus 100 is an apparatus in which the transparent substrate 11 wound in a roll shape is wound up using a winding roll 104 from an original winding roll 102 by so-called roll-to-roll system, and in the middle of the winding and conveyance, the metal thin wire pattern 1 and the metal oxide layer 2 are formed on the transparent substrate 11. Furthermore, it is a characteristic of the present embodiment that the metal oxide layer 2 is formed within 5 minutes (preferably within 1 minute) after the formation of the metal thin wire pattern 1.

Note that, here, the apparatus and method for producing the transparent electrode 10 shown in FIG. 1 will be explained.

<Production Apparatus>

As shown in FIG. 3, the production apparatus 100 is constituted mainly of a conveying portion 110, a first coating portion 120, a first drying portion 130, a second coating portion 140, a second drying portion 150, and a conveying portion 160.

[1. Conveying Portion 110]

In the conveying portion 110, there is provided a plurality of conveying rollers 112. In the conveying portion 110, while the transparent substrate 11 is drawn from the original winding roll 102 by the conveying roller 112, the tension of the transparent substrate 11 is adjusted.

An accumulator can be provided in the conveying portion 110. When the accumulator is provided in the conveying portion 110, since continuous conveyance or intermittent conveyance can be selected, and thus the provision of the accumulator in the conveying portion 110 is a preferable aspect.

[2. First Coating Portion 120]

In the first coating portion 120, there are provided a conveying roller 122, a platen 124 and a printing head 126. In the first coating portion 120, the transparent substrate 11 is conveyed by the conveying roller 122, and in the middle thereof, a coating liquid is coated on the transparent substrate 11 from the printing head 126 and is patterned, while the transparent substrate 11 is supported by the platen 124. Note that the printing head 126 is a head for the inkjet printing.

[3. First Drying Portion 130]

In the first drying portion 130, there are provided a conveying roller 132 and a wavelength control infrared heater 30. In the first drying portion 130, the transparent substrate 11 is conveyed by the conveying roller 132, and in the middle thereof, the coating solution after coating and patterning is irradiated with an infrared ray by the wavelength control infrared heater 30 and is then dried.

Figure 4:
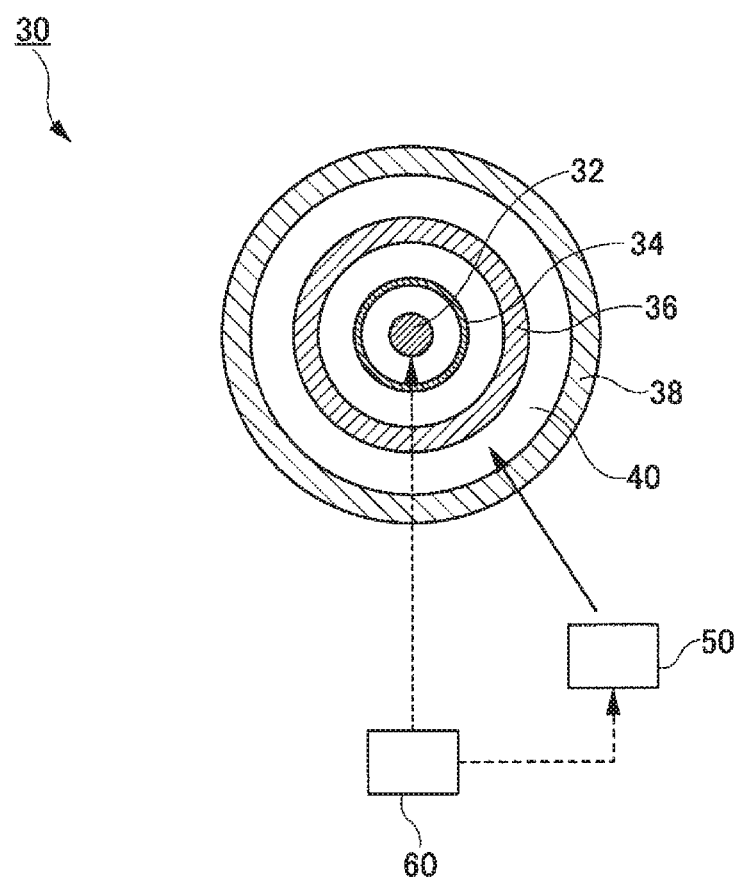
FIG. 4 is a schematic cross-sectional view showing a configuration of a wavelength control infrared heater in the production apparatus of FIG. 3.

FIG. 4 is a schematic cross-sectional view showing the configuration of the wavelength control infrared heater in the production apparatus. As shown in the figure, the wavelength control infrared heater 30 has a cylindrical profile in appearance, and has a configuration in which a filament 32, a protective tube 34, and filters 36 and 38 are arranged in the form of concentric circular in this order.

Moreover, the wavelength control infrared heater 30 has a function of absorbing an infrared ray having a wavelength of 3.5 μm or more. The wording "absorb an infrared ray having a wavelength of 3.5 μm or more" means that, in the far infrared ray region of a wavelength of 3.5 μm or more, an infrared ray transmittance is 50% or less, preferably 40% or less, and further preferably 30% or less.

The filters 36 and 38 themselves become high temperature by heating of the filament 32 to thereby be a radiation body of an infrared ray, and radiate an infrared ray having a longer wavelength than the infrared ray emitted by the filament 32. However, according to the wavelength control infrared heater 30, a cooling agent (for example, cooled air) passes through a hollow portion 40 between the filters 36 and 38, and thus the cooling function can lower the surface temperature of the filters 36 and 38 to thereby suppress the secondary radiation emitted from the filters 36 and 38. As a result, a far infrared ray having a wavelength of 3.5 μm or more which is within the main absorption region of the transparent substrate 11 can be cut. Furthermore, it is possible to dry the coating liquid without deforming the transparent substrate 11 by selectively irradiating a material to be dried with a near infrared ray having a wavelength of 3.5 μm or less which is within the absorption region of the solvent.

Examples of the materials of the filters 36 and 38 include a quartz glass, a borosilicate glass, and the like, and from the viewpoints of heat resistance and impact resistance against heat, the quartz glass is preferable.

Furthermore, the thickness and the number of sheets of the filters 36 and 38 can be optionally selected and changed depending on the necessary infrared ray spectra.

Cooling can be carried out as the cooling function by, as described above, laminating, twice or several times, the filter for controlling the wavelength by use of a hollow material, and by passing an air through the hollow portion between the filters.

Figure 5:
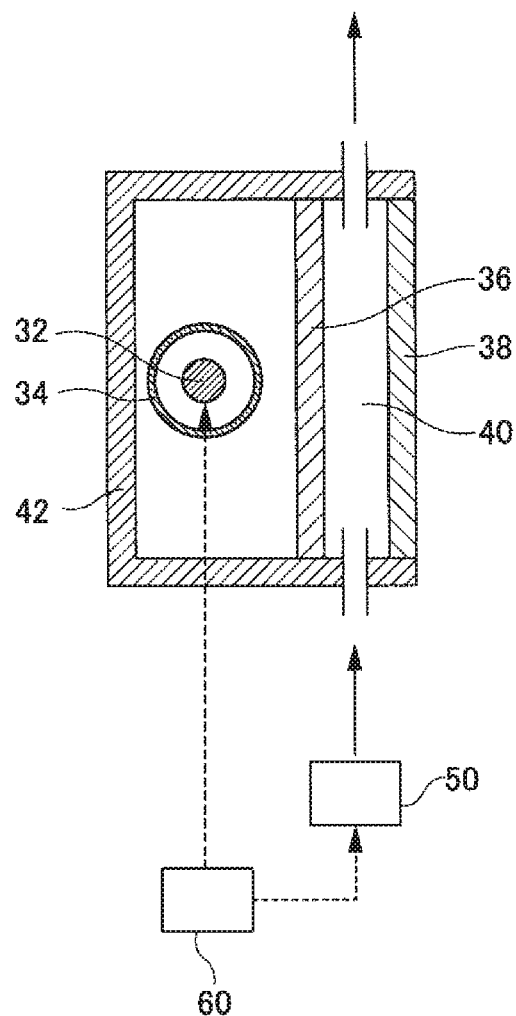
FIG. 5 is a schematic cross-sectional view showing a modification of the wavelength control infrared heater of FIG. 4.

The filters 36 and 38 may, as mentioned above, cover the whole of the cylindrical filament 32 in the form of concentric circle, or as shown in FIG. 5, the three directions of the filament 32 (and the protective tube 34) are covered with reflective plates 42, and the filters 36 and 38 are arranged in the form of parallel plates on the radiation side of the infrared ray.

Furthermore, in addition to the filters 36 and 38, a multi-structure may be formed by arrangement of other filters. In the cooling function in this case, it is preferable from the viewpoint of cooling efficiency that the air for cooling passes through the hollow portions between the filters, in an opposite direction to each other. Furthermore, the cooling air on the exit side may be discharged outside the system, or may be utilized as a part of hot air used in the drying treatment step.

Since the main wavelength of the radiated infrared ray spectra being becomes 3.5 μm or less which corresponds to the absorption of the solvent, the temperature of the filament 32 is preferably 600° C. or more, and is preferably 3000° C. or less from the viewpoint of the heat resistance of the filament 32.

Here, according to Wien's displacement law, when the temperature of the filament is raised, the main wavelength of the radiated infrared ray spectra can be 3.5 μm or less which corresponds to the absorption wavelength of the solvent. Namely, there can be cut the far infrared ray having a wavelength of 3.5 μm or more which is within the absorption region of the transparent substrate 11.

Accordingly, radiation energy in the wavelength region which corresponds to the absorption wavelength of the solvent can be increased by adequately selecting and changing the temperature of the filament 32.

Furthermore, the surface temperature on the outermost side of the filter 38 which is arranged on a side of the material to be dried is 200° C. or less, more preferably 150° C. or less from the viewpoint of suppressing the secondary radiation by the infrared absorption by the filter 38 itself. In this case, the surface temperature of the filter 38 can be regulated by passing an air between the filters which are laminated twice or multiple times.

In addition, in the first drying portion 130, the drying treatment zone may be constituted (covered) by a high infrared ray reflective material in order to highly efficiently utilize the infrared ray not absorbed by the material to be dried.

Note that, as shown in FIG. 4 and FIG. 5, a cooling mechanism 50 for passing (circulating) the cooling medium in the hollow portion 40 is connected to the wavelength control infrared heater 30, and further, a control device 60 is connected to the cooling mechanism 50 and the filament 32. In the control circuit, the flow rate of the cooling medium to the hollow portion 40 from the cooling mechanism 50 and the heat generation temperature of the filament 32 are controlled by the control device 60.

[4. Second Coating Portion 140]

The second coating portion 140 shown in FIG. 3 has the similar configuration and action to those in the first coating portion 120, and the transparent substrate 11 is conveyed by the conveying roller 142, and in the middle thereof, a coating liquid is coated on the transparent substrate 11 from the printing head 146 while the transparent substrate 11 is supported by the platen 144, and is then patterned.

Note that the second coating portion 140 as described above is continuously arranged on a downstream side of the first drying portion 130 in the direction of movement of the transparent substrate 11. Therefore, in the production apparatus of the present embodiment, the coating of the metal oxide layer can be started in the second coating portion 140 within 5 minutes (preferably within 1 minute) after completion of the drying treatment, namely, after completion of the infrared irradiation in the first drying portion 130.

[5. Second Drying Portion 150]

The second drying portion 150 has the similar configuration and action to those in the first drying portion 130, and the transparent substrate 11 is conveyed by the conveying roller 152, and in the middle thereof, the coating solution after coating and patterning is irradiated with an infrared ray by the wavelength control infrared heater 154 and is then dried. Note that the wavelength control infrared heater 154 is the similar to the wavelength control infrared heater 30.

[6. Conveying Portion 160]

The conveying portion 160 has the similar configuration and action to those in the conveying portion 110, and the tension of the transparent substrate 11 is adjusted while the transparent substrate 11 is conveyed by the conveying roller 162, and then the transparent substrate 11 is wound up by the winding roll 104.

The production apparatus to be used in the fabrication of the transparent electrode of the present invention have the configuration to be described below in addition to the configuration of the above production apparatus 100.

For example, in the production apparatus 100 of the present embodiment, there have been explained the first coating portion 120 and the second coating portion 140 in which the coating and the patterning are carried out by the inkjet method, but the coating portion is not limited thereto, and the coating portion by the known printing method may be employed.

Furthermore, there have been explained the first drying portion 130 and the second drying portion 150 in which the drying treatment is carried out by infrared irradiation, but the drying portion is not limited thereto, and for example, a drying treatment by use of a hot plate or a drying portion by flash light irradiation may be employed.

In a case of employing the drying portion by use of the flash light irradiation, a gas of xenon, helium, neon and argon can be used for a discharge tube of a flash lamp which emits the flash light, and the use of xenon is preferable.

The wavelength region of the flash lamp is preferably within the range of 240 nm to 2000 nm from the viewpoint that the drying treatment is carried out without damaging the transparent substrate 11.

Furthermore, the flash lamp may be arranged so that the irradiation can be performed not only from the one main surface side of the transparent substrate 11 formed with the metal thin wire pattern 1, but also from the back surface side, and irradiation may be performed from both sides.

Moreover, the flash light irradiation may be performed out in the air, and, as necessary, may be performed under an inert gas atmosphere such as nitrogen, argon or helium.

In addition, in the production apparatus 100 of the present embodiment, the apparatus of the roll-to-roll system has been explained, but the production apparatus is not limited thereto, and for example, an apparatus of batch system or tree system may also be employed. In this case, the treatments under vacuum care also possible, in the formation steps of the respective layers.

<Production Method>

Next, the method for production the transparent electrode 10 shown in FIG. 1 will be explained by use of FIG. 3.

[1. First Step]

First, the metal thin wire pattern 1 constituted by use of the metal nanoparticles 1*a* is formed on the transparent substrate 11. Here, the metal thin wire pattern 1 is formed mainly through the following (i) and (ii) steps.

(i) In the first coating portion 120, the coating liquid containing the metal nanoparticles 1*a* is coated and patterned on the transparent substrate 11.

(ii) In the first drying portion 130, the coating liquid containing the metal nanoparticles 1*a* after coating and patterning is subjected to a drying treatment.

In the coating and patterning step (i), the coating liquid containing the metal nanoparticles 1*a* is coated and patterned, by the inkjet method, while a certain pattern is formed.

In the drying treatment step (ii), the coating liquid after coating and patterning is irradiated with the infrared ray by use of the wavelength control infrared heater 30 which absorbs the infrared ray having a wavelength of 3.5 μm or more, and then was dried.

The infrared ray with which irradiation is performed has a center wavelength within the region of 1 μm or more and less than 3.5 μm, and has 70% or more of the integration value of the whole outputs within the wavelength region.

The wording "the center wavelength exists within the region of 1 μm or more and less than 3.5 μm" means that the filament temperature is within the range of 450° C. or more and 2600° C. or less, and the temperature range is derived from the above Wien's displacement law.

The conditions of the drying treatment are not particularly limited, and the irradiation time can be regulated by the surface temperatures of the infrared ray filament and the wavelength control filter. For example, the irradiation time can be regulated to 10 seconds to 30 minutes by setting of the filament temperature to 450 to 2600° C. (preferably 600 to 1200° C.), and setting of the surface temperature of the wavelength control filter to be less than 200° C. (preferably less than 150° C.). Accordingly, since the drying treatment can be efficiently carried out by selective irradiation with the infrared ray having a wavelength which is effective for evaporation of the solvent without deforming the transparent substrate 11, it is possible to form a layer having uniform distribution of layer thickness, and to enhance the electric conductivity of the metal thin wire pattern 1.

Note that, in the method for coating and patterning step of (i), known printing methods can be widely used instead of the inkjet method as the patterning method. As the above printing methods, examples thereof include various methods, for example, a gravure coater method, a flexo printing method, a screen printing method, a microcontact printing method, an inkjet method, and further a super inkjet method in which a greatly minute amount of droplets is discharged.

Furthermore, in the drying treatment step of (ii), for example, a drying treatment by a hot plate, or a drying treatment by flash light irradiation can be used instead of the drying treatment by the irradiation with the infrared ray, and from the viewpoint that a uniform distribution of layer thickness can be obtained, the drying treatment by the flash light irradiation is preferable.

Here, in the drying treatment by the flash light irradiation, the light irradiation conditions of the flash lamp are that the total light irradiation energy is preferably 0.1 to 50 J/cm$^2$, more preferably 0.5 to 10 J/cm$^2$. The period of light irradiation time is preferably 10 μsec to 100 msec, more preferably 100 μsec to 10 msec.

In addition, a number of irradiation times may be once or two or more, and is preferably in a range of 1 to 50 times. The drying treatment can be carried out without damaging the transparent substrate 11 by irradiation with the light under these light irradiation conditions.

Note that the temperature of the transparent substrate 11 at the time of the flash light irradiation may be determined in consideration of the boiling point of the solvent (vapor pressure), the thickness of the material to be dried, the heat resistive temperature of the transparent substrate 11, and the like, and is preferably from room temperature or more to 150° C. or less. Furthermore, it is preferable that, before the flash light irradiation, the transparent substrate 11 formed with the material to be dried is subjected to a previous heat treatment.

[2. Second Step]

Next, the metal oxide layer 2 is formed on the transparent substrate 11 formed with the metal thin wire pattern 1 so as to cover the metal thin wire pattern 1 and to have a surface roughness of 5 nm or less. Here, in the second step, the formation of the metal oxide layer 2 within 5 minutes (preferably within 1 minute) after the formation of the metal thin wire pattern 1 in the above first step is a feature.

Also in the second step, the metal oxide layer 2 is formed through the steps (iii) and (iv).

(iii) In the second coating portion 140, the coating liquid containing the metal oxide nanoparticles is coated and patterned on the transparent substrate 11 formed with the metal thin wire pattern 1.

(iv) In the second drying portion 150, the coating liquid after coating and patterning containing the metal oxide nanoparticles is subjected to the drying treatment.

In the coating and patterning step of (iii), there is prepared a dispersion liquid in which the metal oxide nanoparticles having an average particle size of 50 nm or less is dispersed in an alcoholic solvent containing an acryl resin (binder), and the obtained dispersion liquid is coated as the coating liquid on the transparent substrate 11 formed with the metal thin wire pattern 1 by the inkjet method.

Furthermore, in the coating and patterning step of (iii), the coating and patterning is characteristically carried out within 5 minutes (preferably within 1 minute) after the completion of the drying treatment of the step (ii). Namely, the coating is started in the second coating portion 140 within 5 minutes (preferably within 1 minute) after completion of the infrared irradiation in the first drying portion 130.

When the deposition interval is within 5 minutes (preferably within 1 minute), it is possible to form the metal oxide layer 2 having a surface roughness of 5 nm or less as shown in the following Example.

In the drying treatment step (iv), the similar treatment method to the method explained in the drying treatment step (ii) can be used. Accordingly, a layer having a high uniform distribution of layer thickness can be formed, and the metal oxide layer 2 having a surface roughness of 5 nm or less can be obtained.

Note that, in the production method of the present embodiment, there has been explained the example of performing formation by the roll-to-roll system, but the method is not limited thereto, and for example, a method of batch system or tree system may also be used. In this case, the treatments can be carried out under vacuum in the formation of the above layer.

Furthermore, in the production apparatus 100 and production method of the present embodiment, although there have been explained examples for production the transparent electrode 10 shown in FIG. 1, when production, for example, the transparent electrode 20 shown in FIG. 2, an apparatus and a method for forming the light extraction layer 21 are added before the coating liquid containing the metal nanoparticles 1a is coated on the transparent substrate 11 in the first step.

In the formation of the light extraction layer 21, the coating liquid in which, for example, the binder and the light scattering particles are dispersed in a solvent is coated on the transparent substrate 11 and patterned. Next, the coated and patterned coating liquid is subjected to a drying treatment. Next, when the curable material is used as the binder, the curing treatment is carried out. Note that the coating and patterning step and the drying treatment step of the light extraction layer 21 can be applied in the similar step to the above steps (i) and (ii). Moreover, the similar apparatuses to those in the above first coating portion 120 and the first drying portion 130 can be applied, as the apparatuses used in the step.

Furthermore, the curing treatment is carried out by irradiation of the dried coating liquid with an ultraviolet ray. Specific examples of the preferred ultraviolet light source preferably includes a noble gas excimer lamp that emits an ultraviolet ray having a wavelength of within the range of 100 to 230 nm from the viewpoint of radiating a single wavelength at high efficiency, but are not limited thereto, and there may be used, for example, an ultra-high-pressure mercury lamp, a high-pressure mercury lamp, a low-pressure mercury lamp, a carbon arc, a xenon arc, a metal halide lamp, or the like.

<Effects>

The production apparatus and production method of the second embodiment having the above configuration have the step of forming the metal oxide layer 2 on the transparent substrate 11 so as to cover the surface of the metal thin wire pattern 1 with the metal oxide layer 2, and to have a surface roughness of 5 nm or less. Accordingly, for example, in comparison with a case where the electrically conductive polymer is used as a material covering the surface of the metal thin wire pattern 1, there is obtained the transparent electrode 10 which does not degrade its properties even under the circumstance of the high temperature and the high humidity, and which is excellent in the resistance against the high temperature and the high humidity, while having a surface smoothness. In addition, there is obtained the electronic device having enhanced reliability by use of the transparent electrode 10.

Furthermore, the metal oxide layer 2 is formed by coating the dispersion liquid in which the metal oxide nanoparticles are dispersed, on the transparent substrate 11 formed with the metal thin wire pattern 1. Accordingly, in a case where there are partial projections on the electrode surface of the metal thin wire pattern 1, a space portion between the projections is embedded by uniformly dispersing the metal oxide nanoparticles, and thus the transparent electrode 10 having further excellent surface smoothness can be obtained.

Furthermore, the deposition of the metal oxide layer 2 in the second step is carried out within 5 minutes (preferably within 1 minute) after the completion of the drying treatment of the metal thin wire pattern 1 in the first step. Thereby, as shown in the Example described below, it is possible to form the metal oxide layer 2 having a surface roughness of 5 nm or less. It is presumed that this is because, in the steps from the completion of the drying treatment of the metal thin wire pattern 1 to the formation of the metal oxide layer 2, it is possible to suppress the adhesion of impurities to the thin wire surface, and the contamination such as oxidation and sulfurization of the thin wire, to thereby film-deposit the metal oxide layer having a smooth surface on the thin wire.

3. Third Embodiment: Uses of Transparent Electrode

The above-mentioned transparent electrodes shown in FIG. 1 and FIG. 2 can be used for various electronic devices. Examples of the electronic device include an organic EL element, an LED (Light-emitting Diode), a liquid crystal element, a solar cell, a touch panel, and the like. In a case where the surface smoothness and resistance to high temperature and high humidity are required as the electrode material of the electronic device, the transparent electrodes shown in FIG. 1 and FIG. 2 can be preferably used.

Hereinafter, there will be explained, as one example of the uses, an embodiment of an electronic device (organic EL element) in which the transparent electrode of the present invention is used as an anode or a cathode. Note that, here, the transparent electrode 10 shown in FIG. 1 as one example will be explained as the transparent electrode of the present invention.

4. Fourth Embodiment: Electronic Device (Organic EL Element)

<Configuration of Organic EL Element>

Figure 6:
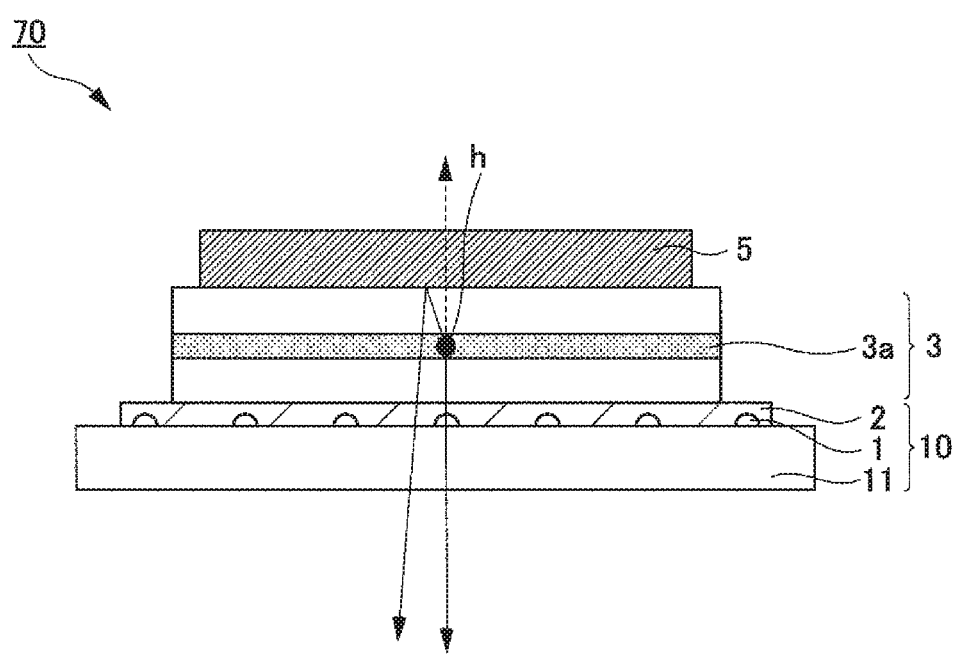
FIG. 6 is a schematic cross-sectional view showing one example of the electronic device (organic EL element) using the transparent electrode of the present invention.

FIG. 6 is a schematic cross-sectional view showing one structural example of the organic EL element in which the transparent electrode 10 shown in FIG. 1 is used as one example of the electronic device of the present invention. Hereinafter, a configuration of an organic EL element 70 will be explained on the basis of the figure.

In the organic EL element 70 shown in FIG. 6, a light-emitting function layer 3 and a counter electrode 5 are laminated from the metal oxide layer 2 side of the transparent electrode 10 in this order. In addition, the light-emitting function layer 3 has at least a light-emitting layer 3a constituted of an organic material. Therefore, the organic EL element 70 is constituted as the bottom emission type in which an emitted light h is extracted at least from the transparent substrate 11 side. Note that there is provided an extraction electrode (not shown) for electrically connecting to an external power source (not shown), at the end portion of the electrode.

Furthermore, the organic EL element 70 is sealed by a sealing member described below on the transparent substrate 11 in order to prevent degradation of the light-emitting function layer 3 constituted by use of the organic material and the like. The sealing member is fixed to the transparent substrate 11 side via an adhesive. However, the terminal portions of the transparent electrode 10 and the counter electrode 5 are provided on the transparent substrate 11 in a state where electrical insulation is kept by the light-emitting function layer 3 to each other and in a state of being exposed from the sealing member.

Hereinafter, the main layers which constitute the above organic EL element 70 will be explained in detail in the order of the transparent electrode 10, the light-emitting function layer 3, the counter electrode 5, the sealing member, and the protective member. Thereafter, the fabrication method of the organic EL element 70 will be explained.

[1. Transparent Electrode]

The transparent electrode is the above-mentioned transparent electrode 10 of the present invention, and is an electrode that constitutes the anode or the cathode of the organic EL element 70, and an electrode provided on the side where the emitted light h generated in the light-emitting function layer 3 is extracted. The transparent electrode 10 has a configuration in which the metal thin wire pattern 1 and the metal oxide layer 2 are provided on one main surface of the transparent substrate 11. Particularly in this case, the metal thin wire pattern 1 and the metal oxide layer 2 substantially serve as the electrodes.

Note that the transparent electrode of the organic EL element 70 of the present embodiment will be explained by referring the transparent electrode 10 shown in FIG. 1, and may be constituted, for example, by using the transparent electrode 20 shown in FIG. 2. In this case, the light extraction layer 21 is arranged between the transparent substrate 11, and the metal thin wire pattern 1, and the metal oxide layer 2.

[2. Light-Emitting Function Layer]

The light-emitting function layer 3 is a layer including at least a light-emitting layer 3a composed of an organic material. The whole configuration of the light-emitting function layer 3 is not limited, and may be a general layer structure. Furthermore, there is shown, as one example of the light-emitting function layer 3, a configuration in which the [positive hole injection layer/positive hole transport layer/light-emitting layer 3a/electron transport layer/electron injection layer] are laminated from the side of an electrode used as an anode among the transparent electrode 10 and the counter electrode 5, and the layers other than the light-emitting layer 3a are provided as necessary.

Among them, the light-emitting layer 3a is a layer in which an electron injected from the cathode side and a positive hole injected from the anode side are recombined to emit light, and the portion that emits light may be in the light-emitting layer or at the interface of the light-emitting layer with the adjacent layer. In the light-emitting layer 3a described above, the luminescent materials may contain a phosphorescent material, may contain a fluorescent material, or may contain both of the phosphorescent material and the fluorescent material. Furthermore, the light-emitting layer 3a preferably has a configuration in which each of these luminescent materials is used as a guest material, and furthermore, a host material is contained.

The positive hole injection layer and the positive hole transport layer may be provided as a positive hole transport/injection layer having a positive hole transporting property and a positive hole injecting property.

Furthermore, the electron transport layer and the electron-injecting layer may be provided as an electron transport/injection layer having an electron transporting property and an electron injecting property.

Moreover, in the light-emitting unit 3, there may be laminated a positive hole-blocking layer, an electron-blocking layer, and the like, at required positions as necessary, in addition to these layers.

Furthermore, the light-emitting unit 3 may have a configuration in which there is laminated a plurality of light-emitting function layers, each of which includes a light-emitting layer 3a which generates emitted light of each color in the respective wavelength regions. Each light-emitting functional layer may have a different layer configuration, or the layers may be directly laminated or may be laminated via an intermediate layer. The intermediate layer is generally any of an intermediate electrode, an intermediate conductive layer, an electric charge-generating layer, an electron with-drawing layer, a connecting layer or an intermediate insulation layer, and any known material configuration can be used as long as the layer has functions of supplying an electron to the adjacent layer of the anode side and of supplying a positive hole to the adjacent layer of the cathode side.

(Deposition Method for Light-Emitting Function Layer)

The light-emitting function layer 3 as described above can be obtained by sequential deposition of a material constituting each layer by a known thin film formation method such as a vacuum vapor deposition method, a spin coating method, a casting method, an LB method, an inkjet method, a printing method. The vacuum vapor deposition method or the spin coating method is particularly preferable from the viewpoints that a homogeneous layer is easily obtained and a pinhole is hard to be generated. Furthermore, deposition methods different for each layer may be applied. When the vapor deposition method is adopted for deposition of each layer, although the vapor deposition conditions are different depending on the kind of the compound to be used or the like, it is generally desirable to appropriately select each condition in the ranges of a heating temperature of boat that houses a compound of 50° C. to 450° C., a degree of vacuum $1\times10^{-6}$ to $1\times10^{-2}$ Pa, a vapor-deposition rate of 0.01 nm/sec to 50 nm/sec, a temperature of substrate of −50° C. to 300° C., and a thickness of 0.1 nm to 5 μm.

[3. Counter Electrode]

The counter electrode 5 is provided in a state of sandwiching light-emitting function layer 3 between the counter electrode 5 and the transparent electrode 10, and when the transparent electrode 10 is an anode, the counter electrode is used as a cathode, and when the transparent electrode 10 is a cathode, the counter electrode is used as an anode. The counter electrode 5 is constituted by use of an electrically conductive compound appropriately selected in consideration of a work function from among a metal, an alloy, an electrically conductive organic or inorganic compound, and a mixture thereof. Specific examples include gold, aluminum, silver, magnesium, lithium, magnesium/copper mixture, magnesium/silver mixture, magnesium/aluminum mixture, magnesium/indium mixture, indium, lithium/aluminum mixture, a rare earth metal, oxide semiconductors such as ITO, ZnO, $TiO_2$ and $SnO_2$, and the like.

Note that, when the organic EL element 70 has a configuration in which the emitted light h is extracted from the transparent substrate 11 side, the counter electrode 5 is preferably made of a material having an excellent reflective property to the emitted light h selected from among the above-mentioned electrically conductive materials. On the other hand, when the organic EL element 70 is a both side light-emitting type in which the emitted light h is also extracted from the counter electrode 5 side, the counter electrode 5 is constituted by selecting an electrically conductive material having an excellent light permeability from the above-mentioned electrically conductive materials.

A thickness of the counter electrode 5 is, depending on the materials, usually selected within the range of 10 nm to 5 μm, preferably within the range of 50 nm to 200 nm, in consideration of the permeability or reflectivity.

(Film Forming Method of Counter Electrode)

The above counter electrode 5 may be formed by using the selected electrically conductive materials according to the vapor deposition method, the sputtering method, or the like.

[4. Taking Out Electrode]

The taking out electrode (not shown) is an electrode which electrically connects the electrode to an external power source, and the material is not particularly limited, and known materials may be preferably used, for example, a metal film such as an MAM electrode of three-layered structure (Mo/Al·Nd alloy/Mo) may be used.

[5. Sealing Member]

A sealing member which is not shown is a member covering the organic EL element 70, and may or may not have a light-transmitting property. However, in a case where the organic EL element 70 is a type of extracting the emitted light h also from the counter electrode 5 side, a transparent sealing member having a light-transmitting property is used as the sealing member. The sealing member may be a plate-like (film-like) sealing member fixed to the transparent substrate 11 side by an adhesive, or may be a sealing film.

Specific examples of the plate-like (film-like) sealing member include a glass substrate or a polymer substrate as long as the member has a light-transmitting property, and these substrate materials may be used further in the form of thin film. Among them, from the viewpoint of being capable of making the element thinner, polymer substrate, in the form having a small thickness, is preferably used as the sealing member.

Furthermore, the film-like polymer substrate preferably has an oxygen permeability measured by the method in accordance with JIS-K-7126-1987 of $1\times10^{-3}$ ml/($m^2 \cdot 24$ hr·atm) or less and a water vapor permeability (25±0.5° C., relative humidity 90±2% RH) measured by the method in accordance with JIS-K-7129-1992 of $1\times10^{-3}$ g/($m^2 \cdot 24$ hr) or less.

Furthermore, the above substrate material may be processed in the form of concave plate and be used as the sealing member. In addition, a member made of a metal material can be used as other examples of the plate-like sealing member.

Moreover, the adhesive for fixing the plate-like sealing member to the transparent substrate 11 side is used as a sealant for sealing the organic EL element 70 sandwiched between the sealing member and the substrate 11. Note that there is a case where the organic materials constituting the organic EL element 70 is degraded through heat treatment. Accordingly, it is preferable that an adhesive is adherable and curable from room temperature to 80° C. In addition, a drying agent may be dispersed in the adhesive.

Furthermore, when a gap is formed among the plate-like sealing member, the transparent substrate 11 and the adhesive, it is preferable to inject, into the gap, an inert gas such as nitrogen or argon, or an inert liquid such as a fluorinated hydrocarbon or a silicone oil, in a case of gaseous phase and liquid phase. It is also possible to make vacuum. Furthermore, it is possible to encapsulate a hydroscopic compound into the gap.

On the other hand, when the sealing film is used as the sealing member, the sealing film is formed on the transparent substrate 11 in a state where the light-emitting function layer 3 in the organic EL element 70 is completely covered and the terminal portions of the transparent electrode 10 and the counter electrode 5 of the organic EL element 70 are exposed.

The sealing film is constituted by use of an inorganic material or an organic material, and particularly, there is used a material having function of suppressing the intrusion of moisture, oxygen and the like, for examples, an inorganic material such as silicon oxide, silicon dioxide or silicon nitride. In order to further improve its fragility of the sealing film, a laminated structure may be formed by use of a film made of an organic material in addition to the film made of the inorganic material.

The method for forming the films is not particularly limited, and there can be used, for example, a vacuum vapor deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method, and the like.

The above-described sealing member is provided in a state where the terminal portions of the transparent electrode 10 and the counter electrode 5 of the organic EL element 70 are exposed, and further at least the light-emitting function layer 3 is covered with the sealing member. In addition, the sealing member may have an electrode, and the member may be constituted such that the terminal portions of the transparent electrode 10 and the counter electrode 5 of the organic EL element 70 is electrically conducted with the electrode.

[6. Protective Member]

A protective member not shown may be provided between the protective member and the transparent substrate 11 so as to sandwich the organic EL element 70 and the sealing material. The protective member is for mechanically protecting the organic EL element 70, and particularly in a case where a sealing member is a sealing film, it is preferable to provide the protective member like this since the mechanical protection of the organic EL element 70 is not sufficient.

There are applied, to the protective member as described above, a glass plate, a polymer plate, a polymer film thinner than a glass plate or a polymer plate, a metal plate, or a metal film thinner than a metal plate, a polymer material film and a metal material film. Among them, the polymer film is preferably used from the viewpoint of light weight and small thickness.

<Fabrication Method of Organic EL Element>

Fabrication of the above-mentioned organic EL element 70 as described above can be done according to the following way.

First, the metal thin wire pattern 1 constituted by using the metal nanoparticles 1a is formed on the transparent substrate 11. Next, the metal oxide layer 2 is formed on the transparent substrate 11 formed with the metal thin wire pattern 1 so as to cover the surface of the metal thin wire pattern 1 and to have a surface roughness of 5 nm or less. The production method of the transparent electrode 10 shown in FIG. 3 is applied to the above formation. Moreover, in the formation of the metal thin wire pattern 1 and the metal oxide layer 2, the terminal portion is formed in the shape of being pulled out from the peripheral of the transparent substrate 11.

Next, the light-emitting function layer 3 including the light-emitting layer 3a is deposited on the metal oxide layer 2. Each layer constituting the light-emitting function layer 3 is deposited by application of an appropriately selected deposition method. Moreover, in the deposition of the layer constituting the light-emitting function layer 3, when the deposition using, for example, a mask is carried out as necessary, the respective layers constituting the light-emitting function layer 3 are formed in the shape in which the terminal portions of the metal thin wire pattern 1 and the metal oxide layer 2 are exposed.

Subsequently, the counter electrode 5 is deposited on the light-emitting function layer 3. The deposition of the counter electrode 5 is carried out by application of an appropriate deposition method such as the vapor deposition method or the sputtering method. Furthermore, in the deposition of the counter electrode 5, when the deposition using, for example, a mask is carried out as necessary, the transparent electrode is formed in the shape in which a terminal portion of the counter electrode 5 is pulled out from the peripheral of the transparent substrate 11 while an electric insulation state is maintained between the metal oxide layer 2 and the counter electrode by the light-emitting function layer 3.

As a result, there is obtained the organic EL element 70 of the bottom emission type in which the emitted light h is extracted from the transparent substrate 11 side. In addition, after that, there is provided the sealing member that covers at least the light-emitting function layer 3 in a state where the terminal portions of the metal thin wire pattern 1, the metal oxide layer 2 and the counter electrode 5 of the organic EL element 70 are exposed. At that time, the light-emitting function layer 3 of the organic EL element 70 is sealed between the sealing member and the transparent substrate 11 by causing the sealing member adhere to the transparent substrate 11 side with the adhesive.

In the fabrication of the organic EL element 70, although it is preferable to consistently carryout fabrication from the light-emitting function layer 3 to the counter electrode 5 by one-time evacuation, it may be possible that the transparent substrate 11 is halfway extracted from the vacuum atmosphere to thereby be subjected to other different formation. At that time, it is necessary to consider that the procedures are carried out under a dry inert gas atmosphere, for example.

Note that, in the above formation from the light-emitting function layer 3 to the counter electrode 5, after each layer is deposited, the deposited layer may be patterned to a desired shape.

In a case of applying a direct voltage to the thus obtained organic EL element 70, a light-emission can be observed when applying a voltage of appropriately 2 V or more to 40 V or less between the transparent electrode 10 and the counter electrode 5. Furthermore, an alternating voltage may be applied. Note that a waveform of the alternating voltage to be applied may be arbitrary.

<Effects>

The organic EL element 70 as described above has the configuration in which the transparent electrode 10 having an excellent resistance to high temperature and high humidity while maintaining the surface smoothness is used as the electrode where the emitted light h is extracted, and the counter electrode 5 is provided on the metal oxide layer 2 side of the transparent electrode 10 in a state of sandwiching the light-emitting function layer 3. Thereby, in the organic EL element 70, s short circuit of the electrode, short circuiting and the like are suppressed, the properties are not degraded even under the circumstances of high temperature and high humidity, and thus the reliability is enhanced.

5. Fifth Embodiment: Uses of Electronic Device (Organic EL Element)

The organic EL element 70 shown in FIG. 6 can be applied as electronic devices such as display devices, displays, and various light-emitting sources. Examples of the light-emitting sources include, but are not limited to, a lighting device such as a home lighting device or a car lighting device, a backlight for a timepiece or a liquid crystal, lighting for advertisement, a light source for a signal, alight source for an optical storage medium, a light source for an electrophotographic copier, a light source for an optical communication processor, a light source for an optical sensor, and the like.

Hereinafter, the present invention will be specifically explained by using Examples, but the present invention is not limited to these Examples.

Example

<<Fabrication of Transparent Electrode>>

As shown in the following Table 1, Samples 101 to 114 of the transparent electrode were produced.

<Fabrication Procedures of Sample 101 of Transparent Electrode>

According to the following way, a transparent electrode having a film thickness of 200 nm constituted of indium tin oxide (ITO) was formed on a PET substrate having a size of 5 cm×5 cm and having a thickness of 125 μm.

First, the PET substrate was fixed to a substrate holder of a commercially available sputtering deposition apparatus, and a sputtering target constituted of indium tin oxide (ITO) was overlapped with a mask having an opening of 20 mm×50 mm, and was then set to a vacuum tank of the sputtering deposition apparatus.

Next, an argon gas was introduced after reducing a pressure of the vacuum tank of the sputtering deposition apparatus up to 4×10$^{-4}$ Pa, the pressure in the vacuum tank was regulated to 0.4 Pa, and then the transparent electrode constituted of indium tin oxide (ITO) having a film thickness of 200 nm was formed at an RF (high frequency) bias of 300 W, and at a film vapor-deposition rate of 0.2 nm/sec. A surface roughness Ra of the obtained transparent electrode was 5 nm or more.

Note that the surface roughness Ra (nm) is calculated from a sectional curve of unevenness continuously measured with a detection device having a sensing pin with a minimal tip radius by the use of the atomic force microscope (manufactured by Digital Instruments Inc.), and is obtained from an average roughness relating to amplitude of fine unevenness by carrying out measurements three times within a section of 5 μm in the measurement direction by the use of the sensing pin with a minimal tip radius.

<Fabrication Procedures of Sample 102 of Transparent Electrode>

According to the following way, a metal thin wire pattern constituted of silver (Ag) and a metal oxide layer constituted of indium tin oxide (ITO) were formed at a thickness of 500 nm within the range of 20 mm×50 mm on the PET substrate.

First, a silver nanoparticle ink (manufactured by TEC-PA-010; InkTec Co., Ltd.) was printed on the PET substrate, by the inkjet method, so as to form a pattern of square lattice of 50 μm width and 1 mm pitch and so as to have a thin wire height after drying of 1 μm, by using a table-type robot Shotmaster-300 (manufactured by Musashi Engineering Co., Ltd.) to which an inkjet head (manufactured by KONICA MINOLTA IJ Co., Ltd.) was attached and by performing control through the use of an inkjet evaluation machine EB150 (manufactured by KONICA MINOLTA IJ Co., Ltd.).

[Drying Treatment by Infrared Ray (IR) Irradiation]

Next, the drying treatment of the printed metal thin wire pattern by use of the wavelength control infrared heater (refer to FIG. 4) that causes a cooling air to flow between the glass plates was carried out by attaching two quartz glass plates which can absorb an infrared ray having a wavelength of 3.5 μm or more to an infrared ray irradiation machine (Ultimate heater/carbon, manufactured by MEI MEI INDUSTRIES INC.).

Next, a metal oxide layer composed of ITO was formed on the PET substrate formed with the metal thin wire pattern, at a film thickness of 500 nm in the similar procedures to those explained in the fabrication procedures of Sample 101. A surface roughness of the thus obtained metal oxide layer was 5 nm or more.

At this time, the deposition of the metal oxide layer was carried out so that the interval of the deposition from the completion of the prior drying treatment of the metal wiring pattern to the starting of the deposition of the metal oxide layer was 5 minutes. Namely, within the period of time of the deposition interval, the transparent substrate formed with the metal wiring pattern was moved to the sputtering apparatus and then the metal oxide layer was deposited.

<Fabrication Procedures of Sample 103 of Transparent Electrode>

In the following way, Sample 103 was produced in the similar procedures to those in the above Sample 102 except that, in the fabrication of a metal oxide layer, a dispersion liquid was coated and patterned in which indium tin oxide (ITO) particles were dispersed, and then a drying treatment using a hot plate (HP) was carried out.

First, a metal thin wire pattern composed of silver (Ag) was formed within the range of 20 mm×50 mm on the PET substrate in the similar procedures to what was explained in the fabrication procedures of Sample 102.

Next, a dispersing liquid in which indium tin oxide (ITO) particles were dispersed, each particle having an average particle size of 100 nm, was printed by an inkjet method within the range of 20 mm×50 mm on the PET substrate on which the metal thin wire pattern was formed.

Note that a particle size (nm) of each of the indium tin oxide (ITO) particles was obtained by measuring optional 200 particles of the metal oxide nanoparticle in the processed image image-analyzed by transmission electron microscope (TEM), and by calculating an average value therefrom.

[Drying Treatment by Hot Plate (HP)]

Next, the printed dispersion liquid was subjected to a dry treatment at 120° C. for 30 minutes with a hot plate (HP) to form the metal oxide layer having a thickness of 500 nm. A surface roughness of the obtained metal oxide layer was 5 nm or more.

<Fabrication Procedures of Sample 104 of Transparent Electrode>

In the following way, Sample 104 was produced in the similar procedures to those in the above Sample 102 except that, in the fabrication of a metal oxide layer, a solution containing an electrically conductive polymer (PEDOT/PSS) was coated and patterned, and then a natural drying treatment was carried out at room temperature.

First, a metal thin wire pattern composed of silver (Ag) was formed within the range of 20 mm×50 mm on the PET substrate in the similar procedures to what was explained in the fabrication procedures of Sample 102.

Next, the electrically conductive polymer-containing solution to be described later was printed by an inkjet method within the range of 20 mm×50 mm on the PET substrate on which the metal thin wire pattern was formed, and was then naturally dried at room temperature to thereby form the electrically conductive polymer (PEDOT/PSS)-containing layer having a thickness of 500 nm. A surface roughness of the obtained metal oxide layer was 5 nm or less.

The electrically conductive polymer-containing solution was prepared in the following way.

| | |
|---|---|
| Aqueous solution of a water soluble binder resin (solid content 20% aqueous solution) | 0.40 g |
| PEDOT/PSS CLEVIOS PH750 (solid content 1.03%) (manufactured by Heraeus Co., Ltd.) | 1.90 g |
| Dimethylsulfoxide | 0.10 g |

Note that the aqueous solution of a water soluble binder resin is obtained by dissolving a water soluble binder resin in pure water and adjusting a solid content to 20%.

In addition, 200 ml of tetrahydrofuran (THF) was placed in a 300 ml three-necked flask and was cooled to room temperature under nitrogen after heating under reflux for 10 minutes. Next, 2-hydroxyethyl acrylate (10.0 g, 86.2 mmol, molecular weight 116.12) and azobisobutyronitrile (AIBN) (2.8 g, 17.2 mmol, molecular weight 164.11) were added to the resulting substance, which was heated under reflux for 5 hours. After the resulting solution was cooled to room temperature, the reaction solution was added dropwise into 2000 ml of methyl ethyl ketone (MEK), which was stirred for one hour. After decantation of the MEK solution, the resulting polymer was washed with 100 ml of MEK three times and was dissolved in THF, which was transferred to a 100 ml flask. Subsequently, after THF solution was distilled off under a reduced pressure with a rotary evaporator, the resulting product was dried under a reduced pressure at 50° C. for three hours. As a result, there was obtained 9.0 grams of a water soluble binder resin (yield 90%) having a number-average molecular weight of 22100 and a molecular weight distribution of 1.42.

Here, the structure and the molecular weight of the water soluble binder resin were respectively measured by $^1$H-NMR (400 MHz, manufactured by JEOL, Ltd.) and GPC (Waters 2695, manufactured by Waters Corporation).

<Measurement Conditions of GPC>
Apparatus: Waters 2695 (Separations Module)
Detector: Waters 2414 (Refractive Index Detector)
Column: Shodex Asahipak GF-7M HQ
Eluent: dimethylformamide (20 mM LiBr)
Flow rate: 1.0 ml/min
Temperature: 40° C.

<Fabrication Procedures of Sample 105 of Transparent Electrode>

Sample 105 was produced in the similar procedures to those in the above Sample 104 except that, after formation of the metal thin wire pattern in the procedures of the above Sample 102, a drying treatment was carried out by use of the hot plate (HP) in the fabrication of the metal oxide layer. Note that the drying treatment using the hot plate (HP) was carried out in the similar way to what was explained in the drying treatment of the metal oxide layer of Sample 103. Moreover, a surface roughness of the obtained metal oxide layer was 5 nm or less.

<Fabrication Procedures of Samples 106 to 111 of Transparent Electrode>

Samples 106 to 111 were produced in the similar procedures to those in the above Sample 103 except that, after formation of the metal thin wire pattern in the procedures of the above Sample 102, the respective materials shown in Table 1 described below were coated and patterned, and then a drying treatment was carried out by infrared irradiation in the fabrication of the metal oxide layer.

Note that there was used, as the material of the metal oxide layer in Samples 106 to 109, a dispersion liquid in which the indium tin oxide (ITO) particles were dispersed and the average particle size of the ITO particle was 100 nm, 80 nm, 50 nm and 30 nm, respectively.

Furthermore, there was used, as the material of the metal oxide layer in Samples 110 and 111, a dispersion liquid in which the metal oxide nanoparticles each having an average particle size of 30 nm were dispersed and the metal oxide nanoparticles were tin oxide (SnO) particles and zinc oxide (ZnO) particles, respectively.

Moreover, the drying treatment by the infrared ray radiation was carried out by using the similar method to that in the drying treatment of the metal thin wire pattern of Sample 102.

In addition, the surface roughness of the obtained metal oxide layer of Samples 106 and 107 was 5 nm or less, and the surface roughness of the metal oxide layer of Samples 108 and 111 was 3 nm or less.

<Fabrication Procedures of Sample 112 of Transparent Electrode>

Sample 112 was produced in the similar procedures to those in the above Sample 109 except that, after formation of the metal thin wire pattern in the procedures of the above Sample 102, a drying treatment was carried out by use of the hot plate (HP) in the fabrication of the metal oxide layer. Note that the drying treatment using the hot plate (HP) was carried out in the similar way to what was explained in the drying treatment of the metal oxide layer of Sample 103. Moreover, a surface roughness of the obtained metal oxide layer was 3 nm or less.

<Fabrication Procedures of Sample 113 of Transparent Electrode>

In the following way, Sample 113 was produced in the similar procedures to those in the above Sample 109 except that the drying treatment was carried out by use of the flash light (FL) in the fabrication of the metal oxide layer. In addition, a surface roughness of the obtained metal oxide layer was 3 nm or less.

[Drying Treatment by Flash Light (FL)]

One-time irradiation was performed from the forming surface side of the metal oxide layer at an irradiation energy of 1.5 J/cm$^2$ for 2000 µseconds by use of a xenon lamp 2400 WS (manufactured by COMET Co., Ltd.) equipped with a cut filter that cuts a short wavelength of 250 nm or less.

<Fabrication Procedures of Sample 114 of Transparent Electrode>

Sample 114 was produced in the similar procedures to those in the above Sample 109 except that the metal oxide layer was formed so that the interval of the deposition from the completion of the drying treatment of the metal circuit pattern to the starting of the deposition of the metal oxide layer was 1 minute or less. In addition, a surface roughness of the obtained metal oxide layer was 3 nm or less.

<<Fabrication of Organic EL Element>>

There was produced a bottom-emission type organic EL element was produced by providing the transparent electrode of Samples 101 to 114 described above was provided as an anode under a light-emitting function layer.

[Fabrication of Transparent Electrode]

First, each of the transparent electrodes of Samples 101 to 114 described above was formed.

[Fabrication of Light-Emitting Function Layer]

Next, the PET substrate obtained by forming the layers up to the metal oxide layer was overlapped with a mask having an opening of 30 mm×30 mm width in the center, and was fixed to a substrate holder of the commercially available vacuum vapor deposition apparatus. Furthermore, each of heating boats in the vacuum vapor deposition apparatus was charged with each material for constituting the light-emitting function layer in an optimum amount for forming the respective layers. Note that a boat produced by a material for a tungsten resistive heating was used as the heating boat.

Next, the vacuum level in the vapor deposition chamber of the vacuum vapor deposition apparatus is reduced to 4×10$^{-4}$ Pa, and the following respective layers were formed by sequential application of an electric current to the heating boat containing each material to thereby heat the same.

(Positive Hole Transport/Injection Layer)

The heating boat containing α-NPD represented by the following structural formula as a positive hole transport/injection material was heated by application of an electric current and there was then formed, on the metal oxide layer constituting the transparent electrode, a positive hole transport/injection layer made of α-NPD and having both roles of the positive hole transport layer and the positive hole injection layer. At this time, the vapor-deposition rate was 0.1 to 0.2 nm/sec., and a thickness was 140 nm.

[Chemical Formula 1]

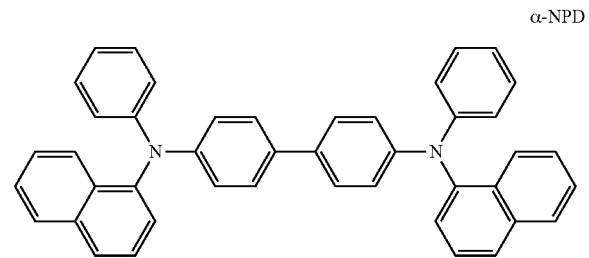

α-NPD (Light-Emitting Layer)

Next, an electric current was independently applied to each of the heating boat containing the host material H4 represented by the following structural formula and the heating boat containing the phosphorescence emitting compound Ir-4 represented by the following structural formula and there was then formed, on the positive hole transport/injection layer, the light-emitting layer composed of the host material H4 and the phosphorescence emitting compound Ir-4. At this time, the current to be applied to the heating boat was controlled so that the vapor-deposition rate of the host material H4: the phosphorescence emitting compound Ir-4 was equal to 100:6. Furthermore, the thickness was 30 nm.

[Chemical Formula 2]

H4

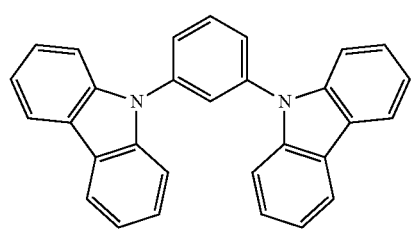

Ir-4

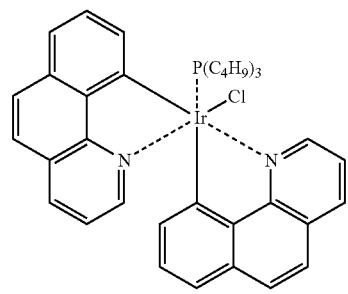

Subsequently, the heating boat containing BAlq represented by the following structural formula as a positive hole blocking material was heated by application of an electric current and there was then formed, on the light-emitting layer, the positive hole blocking layer made of BAlq. At this time, the vapor-deposition rate was 0.1 nm/sec. to 0.2 nm/sec., and a thickness was 10 nm.

[Chemical Formula 3]

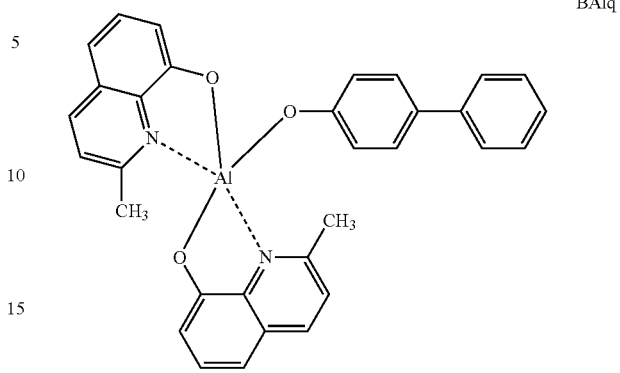

BAlq (Electron Transport Layer)

Then, an electric current was independently applied to each of a heating boat containing a compound 10 represented by the following structural formula as the electron transport material and a heating boat containing potassium fluoride and there was then formed, on the positive hole-blocking layer, the electron transport layer made of the compound 10 and the potassium fluoride. At this time, the current to be applied to the heating boat was controlled so that the vapor-deposition rate of the compound 10: the potassium fluoride was equal to 75:25. In addition, the thickness was 30 nm.

[Chemical Formula 4]

Compound 10

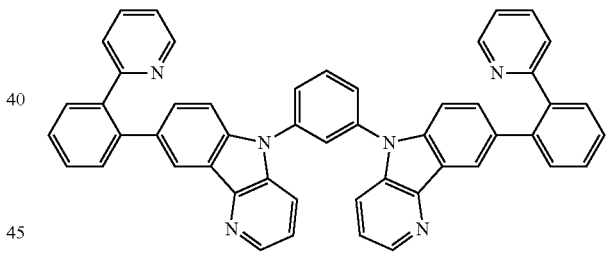

(Electron Injection Layer)

Next, the heating boat containing potassium fluoride as an electron injection material was heated by application of an electric current and there was then formed, on the electron transport layer, the electron injection layer made of potassium fluoride. At this time, the vapor-deposition rate was 0.01 to 0.02 nm/sec, and a film thickness was 1 nm.

[Fabrication of Counter Electrode]

After that, the PET substrate obtained by forming layers up to the electron injection layer was transferred to the vacuum tank having the resistive heating boat of tungsten containing aluminum (Al) attached thereto, while the vacuum condition was kept. The substrate was overlapped with a mask having an opening width of 20 mm×50 mm which was arranged perpendicularly to an anode, and was then fixed. Next, in the treatment chamber, a reflective counter electrode composed of Al having a film thickness of 100 nm was deposited by film forming at a film vapor-deposition rate of 0.3 to 0.5 nm/sec.

[Sealing]

After that, the organic electroluminescent body was covered with a sealing member composed of a glass substrate having a size of 40 mm×40 mm, a thickness of 700 μm, and having a center portion size of 34 mm×34 mm and a depth of 350 μm, and the space between the sealing member and the transparent substrate was charged with an adhesive (sealing material) in a state where the organic electroluminescent body is surrounded. An epoxy-based photocurable adhesive (Lackstrack LC0629B manufactured by TOAGO-SEI) was used as the adhesive. Next, the adhesive was cured to seal the organic electroluminescent body by irradiating, with UV light, the adhesive filled in a space between the sealing member and the transparent substrate, from the glass substrate (sealing member) side.

Note that, in the formation of the organic electroluminescent body, a vapor-deposition mask was used for forming each layer, a region of 20 mm×20 mm in the center of the transparent substrate of 5 cm×5 cm was set as a light-emitting region, and a non-light-emitting region having a width of 15 mm was provided around the whole peripheral of the light-emitting region. Furthermore, as to the transparent electrode as an anode and the counter electrode as a cathode, the terminal portions were drawn out to the peripheral edge of the PET substrate, in a state of being insulated by the light-emitting function layer from the positive hole transport/injection layer to the electron injection layer.

According to the above-mentioned way, the organic EL elements were produced by using Samples 101 to 114 of the transparent electrode shown in the following Table 1.

<Evaluation of Each Transparent Electrode of Example 1>

With respect to Samples 101 to 114 of each transparent electrode produced in the above, (1) surface resistance (Ω/sq.) and (2) permeability (%) were measured.

(1) The measurement of the surface resistance was carried out by 4 terminals 4 probes method constant current applying system with the use of a resistivity meter (MCP-T610 manufactured by MITSUBISHI CHEMICALS).

(2) The measurement of the permeability was carried out by using, as a baseline, a transparent substrate that is the same as the sample, with the use of a spectrophotometer (U-3300 manufactured by HITACHI).

<Evaluation of Each Organic EL Element of Example 1>

As to the organic EL elements constituted by using Samples 101 to 114 of the transparent electrode produced in the above, there were measured (3) light-emission efficiency, (4) luminance uniformity (%), (5) rectification ratio (log ratio), (6) yield (%), and (7) high-temperature and high-humidity storage property.

(3) As to the light-emission efficiency, there was obtained the light-emission efficiency (external extraction efficiency) of each of the organic EL element at the current value, by performing lighting of each organic EL element at room temperature (within the range of about 23 to 25° C.) under the constant current density condition of 2.5 mA/cm², and by measuring the light-emission luminance of each of the organic EL element by use of a spectroscopic radiant luminance meter CS-2000 (manufactured by Konica Minolta Optics, Inc.).

Note that the light-emission efficiency is expressed as a relative value in which the light-emission efficiency of the organic EL element (standard) constituted by using the transparent electrode of Sample 101 is set as 100.

(4) There was calculated the luminance uniformity, as a rate of uniformity within a light-emitting area, by measuring a luminance and an emission spectrum, by use of a spectroscopic radiant luminance meter CS-2000 (manufactured by Konica Minolta Inc.), at the time when applying an electric current to the organic EL element at 50 A/m² to thereby emit light, and by dividing a minimum value by a maximum value in the measurement values of the luminance within the light-emitting area (20 mm×20 mm) of each of the organic EL element. Note that, as to the luminance uniformity, the larger the value is, the smaller the luminance unevenness is, which shows good result.

(5) The rectification ratio (log ratio) indicates a value obtained by measuring, three times, current values by a forward voltage that flow at 500 μA/cm² and current values by the reverse voltage, through the organic EL element under room temperature, by calculating a rectification ratio from the average values, and by taking the logarithm (log) of the rectification ratio. It is shown that the higher the rectification ratio is, the more excellent leak property is.

(6) The yield (%) indicates a percentage of the number of the elements each having a rectification ratio of 2 or more in 10 elements produced.

(7) The high-temperature and high-humidity storage property is obtained by measuring a sheet resistance after storing the organic EL element for 300 hours under the high temperature and high humidity environment (temperature 60° C., humidity 90%). Then, an increase ratio of the sheet resistance after the storage to the sheet resistance before the storage is calculated as a voltage increase. It is shown that the smaller the obtained value is, the better the result is.

In addition, 10 organic EL elements were prepared for each of Samples 101 to 114, and these were evaluated as the number of the organic EL elements that emit light (n/10 elements) after storage for 300 hours under the high temperature and high humidity environment (temperature 60° C., humidity 90%). During the storage, the luminescent element is driven by a driving voltage in which a luminance is 1000 cd. The number of the organic EL elements that emit light (n/10 elements) is a number of the organic EL elements in which light emission has been confirmed even after the 300 hour storage in the organic EL elements of Samples 101 to 114 each having 10 elements, and preferably, the number is closer to 10.

The following Table 1 shows the configurations of Samples 101 to 114, the measurement results of the surface resistance (Ω/sq.) and the permeability (%) of the transparent electrode, and the measurement results of the light-emission efficiency, the luminance uniformity (%), the rectification ratio (log ratio), the yield (%), and the high-temperature and high-humidity storage property.

TABLE 1

| | | Transparent electrode | | | | | | | | |
|---|---|---|---|---|---|---|---|---|---|---|
| | | Metal thin wire pattern | | | Metal oxide layer | | | | | Interval |
| Sample | Transparent substrate Material | Metal nanoparticle | Film forming method | Material | Particle size [nm] | Film thickness [nm] | Film forming method | Drying treatment method | Surface roughness [nm] | of film formation [min] |
| 101 | PET | — | — | ITO | — | 200 | Sputtering | — | >5 | — |
| 102 | | Ag | IJ | ITO | | 500 | | | | 5 |

TABLE 1-continued

| Sample | | | | | Particle size | | | | | | |
|---|---|---|---|---|---|---|---|---|---|---|---|
| 103 | | | | ITO particle | 100 | 500 | IJ | HP | | | |
| 104 | PET | Ag | IJ | PEDOT/PSS | — | 500 | IJ | Room temperature | <5 | 5 | |
| 105 | | | | | | | | HP | | | |
| 106 | PET | Ag | IJ | ITO particle | 100 | 500 | IJ | IR | <5 | 5 | |
| 107 | | | | | 80 | | | | | | |
| 108 | | | | | 50 | | | | <3 | | |
| 109 | | | | | 30 | | | | | | |
| 110 | | | | SnO particle | | | | | | | |
| 111 | | | | ZnO particle | | | | | | | |
| 112 | PET | Ag | IJ | ITO particle | 30 | 500 | IJ | HP | <3 | 5 | |
| 113 | | | | | | | | FL | | | |
| 114 | PET | Ag | IJ | ITO particle | 30 | 500 | IJ | IR | <3 | <1 | |

Evaluation results

| Sample | Surface resistance (Ω/sq.) | Optical permeability [%] | Light-emission efficiency | Luminance uniformity [%] | Rectification ratio (log ratio) | Yield [%] | Voltage increase | High-temperature and high-humidity storage property Number of living elements [/10 elements] | Note |
|---|---|---|---|---|---|---|---|---|---|
| 101 | 40 | >85 | 100 | 50% | 2 | 50% | <1 | 10 | Comparative |
| 102 | <1 | >85 | 130 | >85% | 2 | 50% | <1 | 10 | |
| 103 | <1 | >85 | 130 | >85% | 3 | 70% | 1.5 | 10 | |
| 104 | <1 | >85 | 130 | >85% | 5 | 100% | — | 0 | Comparative |
| 105 | <1 | >85 | 130 | >85% | 5 | 100% | 3 | 6 | |
| 106 | <1 | >85 | 130 | >85% | 5 | 100% | 1.5 | 10 | Present invention |
| 107 | <1 | >85 | 130 | >85% | 5 | 100% | 1.5 | 10 | |
| 108 | <1 | >85 | 130 | >85% | 5 | 100% | <1 | 10 | |
| 109 | <1 | >85 | 130 | >85% | 5 | 100% | <1 | 10 | |
| 110 | <1 | >85 | 120 | >85% | 5 | 100% | <1 | 10 | |
| 111 | <1 | >85 | 120 | >85% | 5 | 100% | <1 | 10 | |
| 112 | <1 | >85 | 130 | >85% | 4 | 90% | <1 | 10 | Present invention |
| 113 | <1 | >85 | 130 | >85% | 5 | 100% | <1 | 10 | |
| 114 | <1 | >85 | 140 | >90% | 5 | 100% | <1 | 10 | Present invention |

<Evaluation Results of Example 1>

As is clear from Table 1, in comparison with the respective transparent electrodes of Samples 101 to 103 in which the surface roughness of the metal oxide layer is 5 nm or more, the respective transparent electrodes of Samples 104 to 114, namely, the transparent electrode in which the surface roughness of the metal oxide layer is 5 nm or less has a surface resistance value of less than 1 Ω/sq., and permeability being as high as 85% or more, and in a case where the transparent electrode was used for the organic EL element, good results of the rectification ratio and the yield were able to be obtained.

However, in a case where there were used, for the organic EL element, the respective transparent electrodes of Samples 104 and 105, namely, the transparent electrodes having the metal oxide layer composed of the electrically conductive polymer (PEDOT/PSS), sufficient results were not able to be obtained in the high-temperature and high-humidity storage property.

Therefore, it has been confirmed that the metal oxide layer composed of the electrically conductive polymer has a sufficient surface smoothness as an electrode, but the properties thereof are deteriorated in a case of being used under the environment of high temperature and high humidity.

Furthermore, when making a comparison among the respective transparent electrodes of Samples 106 to 114, namely, the transparent electrodes in which the ITO particles constituting the metal oxide layer have the different particle sizes, the respective transparent electrodes of Samples 108 to 114 each having the metal oxide layer composed of the ITO particles (or, SnO particles, ZnO particles) with a particle size of 50 nm or less had a good surface roughness of 3 nm or less, and excellent results were able to be obtained in the high-temperature and high-humidity storage property in a case where the transparent electrode was used for the organic EL element.

From these results, it is considered that surface smoothness of the transparent electrode becomes excellent by constituting the metal oxide layer by using the particles having a particle size of 50 nm or less, and in a case where the electrode is used for the element, the voltage increase is difficult to be caused even under the environment of high temperature and high humidity since a carrier can be injected without generating electric field concentration.

Moreover, when making a comparison among the respective transparent electrodes of Samples 109 to 111, namely, the respective transparent electrodes in which only the types of the particles constituting the metal oxide layer are different, the transparent electrode of Sample 109 having the metal oxide layer composed of the ITO particles gave excellent results in the light-emission efficiency in a case where the transparent electrode was used for the organic EL element.

In addition, when making a comparison among the respective transparent electrodes of Samples 109, 112, and 113, namely, the transparent electrodes in which only the drying treatment in the fabrication of the metal oxide layer is different, the respective transparent electrodes of Samples 109 and 113 having the metal oxide layer in which there was performed the drying treatment by the infrared (IR) irradiation or the flash light (FL) irradiation gave excellent results in the rectification ratio and the yield in a case where the transparent electrode was used for the organic EL element.

Furthermore, similar results were able to be obtained also when making a comparison between the respective transparent electrodes of Samples 103 and 106, namely, the respective transparent electrodes each having the different surface roughness by changing the drying treatment method in the fabrication of the metal oxide layer.

From these results, it is considered that, when the drying treatment in the fabrication of the metal oxide layer is carried out by the infrared (IR) irradiation or the flash light (FL) irradiation, the surface smoothness of the metal oxide layer becomes excellent.

Furthermore, when making a comparison between the respective transparent electrodes of Samples 109 and 114, namely, the respective transparent electrodes in which only the interval of the deposition is different in the fabrication of the metal oxide layer, the transparent electrode of Sample 114 formed within the interval of deposition of one minute or less and having the oxide metal layer gave excellent results in the light-emission efficiency and the luminance uniformity in a case where the transparent electrode was used for the organic EL element.

From these results, it is considered that, during the interval from the completion of the drying treatment of the metal thin wire pattern to the formation of the metal oxide layer, it is possible to suppress the adhesion of impurities to the thin wire surface, and the contamination such as oxidation and sulfurization of the thin wire, to thereby film-deposit the metal oxide layer having a smoother surface. In addition, it is considered that the film quality is enhanced by preventing contamination of the electrode and thus the uniformity in the film surface also becomes excellent.

From the above, it has been confirmed that the transparent electrode having a configuration of the present invention exhibits the excellent resistance to high temperature and high humidity while having surface smoothness, and the organic EL element using the transparent electrode enhances reliability.

Note that the present invention is not limited to the configurations explained in the above exemplary embodiments, and additional various modifications and changes can be made within the scope not departing from the configuration of the present invention.

REFERENCE SIGNS LIST 10, 20 Transparent electrode
1 Metal thin wire pattern
1a Metal nanoparticle
2 Metal oxide layer
11 Transparent substrate
21 Light extraction layer
30, 154 Wavelength control infrared heater
32 Filament
36, 38 Filter
34 Protective tube
40 Hollow portion
42 Reflective plate
50 Cooling mechanism
60 Control device
100 Production apparatus
102 Original winding roll
104 Winding roll
110, 160 Conveying portion
120 First coating portion
130 First drying portion
140 Second coating portion
150 Second drying portion
112, 122, 132, 142, 152, 162 Conveying roller
124, 144 Platen
126, 146 Printing head
70 Organic EL element
3 Light-emitting function layer
3a Light-emitting layer
5 Counter electrode
h Emitted light

The invention claimed is:

1. A transparent electrode comprising:
    a metal thin wire pattern that is constituted by use of metal nanoparticles and that is provided on one main surface of a transparent substrate and
    a metal oxide layer that is provided on the main surface of the transparent substrate so as to cover a surface of the metal thin wire pattern and that has a surface roughness of 5 nm or less.

2. The transparent electrode according to claim 1, wherein the metal oxide layer is constituted by use of metal oxide nanoparticles.

3. The transparent electrode according to claim 2, wherein an average particle size of the metal oxide nanoparticle is 50 nm or less.

4. The transparent electrode according to claim 1, wherein the metal oxide layer is constituted by use of indium tin oxide.

5. A method for producing a transparent electrode comprising:
    a first step of forming a metal thin wire pattern which is composed of metal nanoparticles on a transparent substrate, and
    a second step of depositing a metal oxide layer on the transparent electrode so as to cover the metal thin wire pattern and to have a surface roughness of 5 nm or less.

6. The method for producing a transparent electrode according to claim 5, wherein the second step deposits the metal oxide layer by coating, on the transparent substrate formed with the metal thin wire pattern, a dispersion liquid in which metal oxide nanoparticles are dispersed, and then by carrying out a drying treatment.

7. The method for producing a transparent electrode according to claim 6, wherein the drying treatment is carried out by infrared drying or flash light drying.

8. The method for producing a transparent electrode according to claim 5, wherein the second step is carried out within one minute after finishing the first step.

9. An electronic device using the transparent electrode according to claim 1.

10. The electronic device according to claim 9, wherein the electronic device is an organic electroluminescent element.

* * * * *